(12) United States Patent
Sakamoto

(10) Patent No.: US 8,030,700 B2
(45) Date of Patent: Oct. 4, 2011

(54) SEMICONDUCTOR MEMORY DEVICE

(75) Inventor: Wataru Sakamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 12/405,544

(22) Filed: Mar. 17, 2009

(65) Prior Publication Data

US 2010/0019310 A1 Jan. 28, 2010

(30) Foreign Application Priority Data

Jul. 25, 2008 (JP) ................................ 2008-191829

(51) Int. Cl.
*H01L 29/792* (2006.01)

(52) U.S. Cl. ........ 257/324; 257/316; 257/306; 257/390; 257/E27.103; 257/E29.309

(58) Field of Classification Search .................. 257/316, 257/324, 326, E29.078, E29.3–E29.309, 257/E21.179–E21.182, E21.209–E21.21, 257/E21.422, E21.423, E21.679–E21.694, 257/25, 30, 296, 306, 390, E27.103; 438/216, 438/591, 593, 257, 430
See application file for complete search history.

(56) References Cited

U.S. PATENT DOCUMENTS

| | | | |
|---|---|---|---|
| 2002/0195668 A1* | 12/2002 | Endoh et al. .................. 257/390 |
| 2007/0158736 A1 | 7/2007 | Arai et al. | |
| 2007/0252201 A1* | 11/2007 | Kito et al. ..................... 257/331 |
| 2008/0048245 A1* | 2/2008 | Kito et al. ..................... 257/321 |
| 2008/0073635 A1 | 3/2008 | Kiyotoshi et al. | |
| 2008/0093664 A1* | 4/2008 | Yun et al. ...................... 257/324 |
| 2008/0128780 A1 | 6/2008 | Nishihara et al. | |
| 2008/0149992 A1* | 6/2008 | Gidon .......................... 257/316 |
| 2008/0173928 A1 | 7/2008 | Arai et al. | |

FOREIGN PATENT DOCUMENTS

JP 2007-266143 10/2007

OTHER PUBLICATIONS

H. Tanaka et al.,"Bit Cost Scalable Technology with Punch and Plug Process for Ultra High Density Flash Memory", 2007 Symposium on VLSI Technology Digest of Technical Papers, 1 page.

Yoshiaki Fukuzumi et al., "Optimal Integration and Characteristics of Vertical Array Devices for Ultra-High Density, Bit-Cost Scalable Flash Memory", IEDM Tech. Digest, 2007, 4 pages.

* cited by examiner

*Primary Examiner* — Cuong Q Nguyen
*Assistant Examiner* — Yosef Gebreyesus
(74) *Attorney, Agent, or Firm* — Oblon, Spivak, McClelland, Maier & Neustadt, L.L.P.

(57) ABSTRACT

A semiconductor memory device includes: a semiconductor substrate; a stacked body provided on the semiconductor substrate and having a plurality of insulator layers and a plurality of conductive layers alternately stacked; a semiconductor layer provided inside a through-hole formed so as to pass through the stacked body and extending in a stacking direction of the insulator layers and the conductive layers; and a charge trap layer provided between the conductive layer and the semiconductor layer. A lower part in the semiconductor layer is narrower than an upper part therein, and at least the lowermost layer in the conductive layers is thinner than the uppermost layer therein.

20 Claims, 22 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2008-191829, filed on Jul. 25, 2008; the entire contents of which are incorporated herein by reference.

BACKGROUND OF THE INVENTION

This invention relates to a semiconductor memory device having a three-dimensional memory cell array structure in which columnar element rows are arranged at high density in the electrode-stacked direction with respect to stacked electrode films.

A conventional stacked memory technology has many production steps per layer and is not suitable for enlargement of capacity, by the structure in which layers are stacked by repeating a step of forming a general plane memory cell on a silicon substrate at times of the number of the layers.

Accordingly, there is proposed a technique that though a stacked structure in which gate electrode layers and interlayer insulator layers are alternately stacked, holes passing from the uppermost layer to the lowermost layer are opened at one time and that silicon containing impurities is buried in a columnar shape and thereby enlargement of capacity is achieved by high production efficiency (Patent document 1 (JP-A 2007-266143 (Kokai)).

In this case, the structure is that the gate electrode layers cover the pillar of silicon by a certain interval, and a charge trap layer for data storage is provided in the crossover part between the gate electrode layer and the silicon pillar, and thereby, the memory cell transistor is formed. However, in forming a through-hole in the multilayer structure of the electrode layers and the insulator layers at one time, the diameter of the through-hole, namely, the diameter of the silicon pillar buried into the hole tends to be narrower in the lower part, and therefore, the problem that the characteristics of the memory transistor become different between the upper layer side and the lower layer side is feared.

SUMMARY OF THE INVENTION

According to an aspect of the invention, there is provided a semiconductor memory device including: a semiconductor substrate; a stacked body provided on the semiconductor substrate and having a plurality of insulator layers and a plurality of conductive layers alternately stacked; a semiconductor layer provided inside a through-hole formed so as to pass through the stacked body and extending in a stacking direction of the insulator layers and the conductive layers; and a charge trap layer provided between the conductive layer and the semiconductor layer, a lower part in the semiconductor layer being narrower than an upper part therein, and at least the lowermost layer in the conductive layers being thinner than the uppermost layer therein.

According to another aspect of the invention, there is provided a semiconductor memory device including: a semiconductor substrate; and a plurality of memory cell units stacked on the semiconductor substrate, the memory cell units including: a stacked body having a plurality of insulator layers and a plurality of conductive layers alternately stacked; a semiconductor layer provided inside a through-hole formed to pass through the stacked body and extending in a stacking direction of the insulator layers and the conductive layers; and a charge trap layer provided between the conductive layer and the semiconductor layer, a lower part in the semiconductor layer being narrower than an upper part therein in each of the memory cell units, and at least the lowermost layer in the conductive layers being thinner than the uppermost layer therein in each of the memory cell units.

DETAILED DESCRIPTION OF THE INVENTION

Hereinafter, embodiments of the invention will be described with reference to drawings.

First Embodiment

Figure 1:
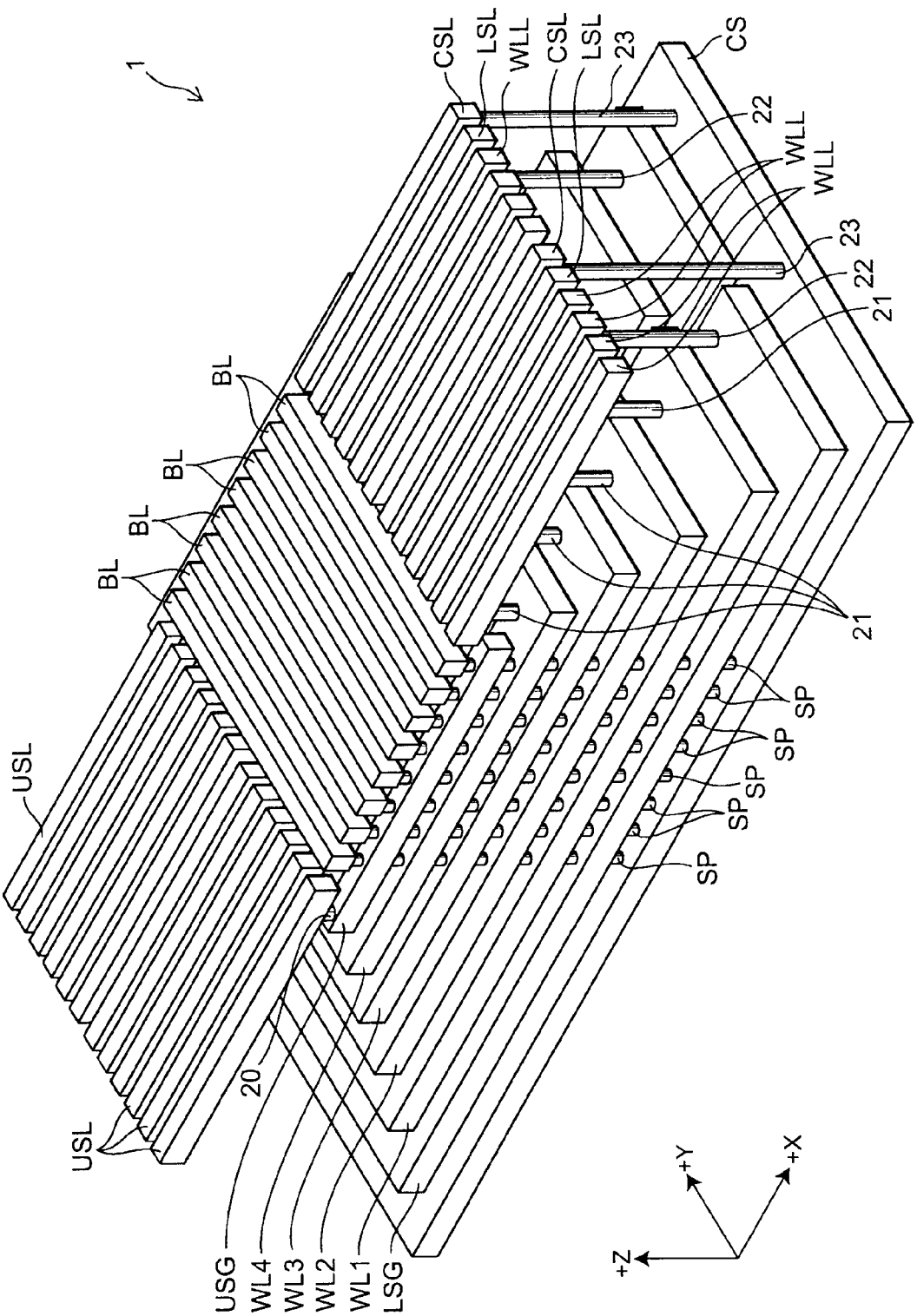
FIG. 1 is a schematic perspective view illustrating a semiconductor memory device according to a first embodiment of the invention.

FIG. 1 is a schematic perspective view illustrating a semiconductor memory device according to a first embodiment of the invention.

Figure 2:
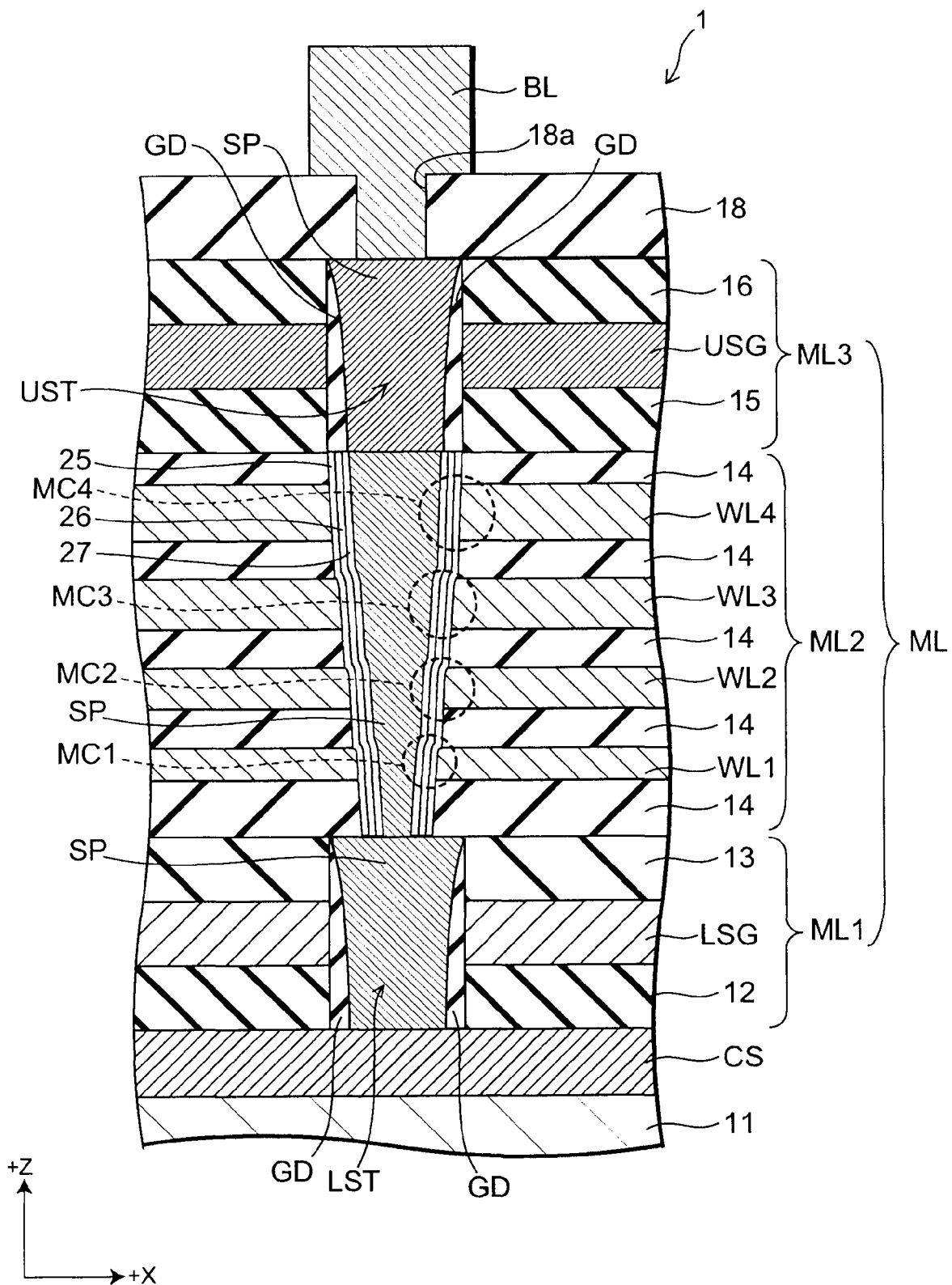
FIG. 2 is a schematic sectional view of one (one row of) memory string in the same semiconductor memory device.

FIG. 2 is a schematic cross-sectional view of one (one row of) memory string in the same semiconductor memory device.

Figure 3:
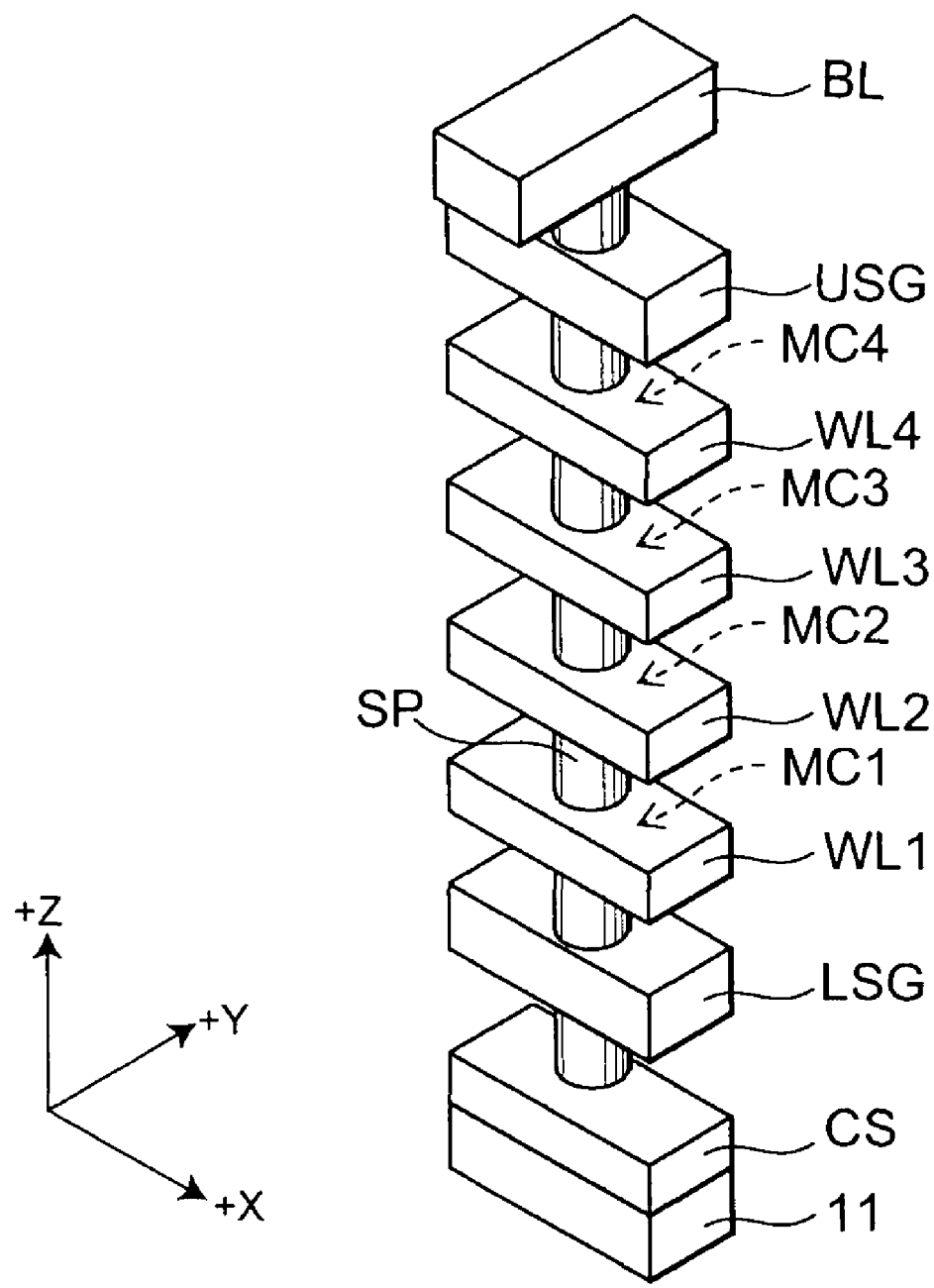
FIG. 3 is a schematic perspective view of the same one memory string.

FIG. 3 is a schematic perspective view of the same one memory string.

In the FIGS. 1 and 3, for making the figures easily viewable, only the conductive parts are shown, and the insulator parts are not shown in the figures.

The semiconductor memory device according to this embodiment has a structure in which semiconductor layers, insulator layers, conductive layers, wires, and so forth are formed on a semiconductor substrate. In this embodiment, silicon is exemplified as the semiconductor, but another semiconductor may be used.

As shown in FIG. 2, a cell source CS is provided on a silicon substrate 11. The cell source CS is a silicon layer made to have low resistance by, for example, introducing impurities thereinto at a relatively high concentration. On the cell source CS, an insulator layer 12 is provided, and thereon, a lower select-gate LSG is provided, and thereon, an insulator layer 13 is provided. The insulator layers 12, 13 are, for example, silicon oxide layers, and the lower select-gate LSG is, for example, an amorphous or polycrystalline silicon layer. A stacked body ML1 is composed of the insulator layer 12 and the lower select-gate LSG and the insulator layer 13.

On the stacked body ML1, a stacked body ML2 in which a plurality of insulator layers 14 made of, for example, silicon oxide and a plurality of conductive layers WL1 to WL4 made of, for example, amorphous or polycrystalline silicon are alternately stacked.

The conductive layers from WL1 to WL4 function as word lines. The insulator layers 14 are provided above and below the conductive layers WL1 to WL4 and therebetween, and function as interlayer insulator layers insulating the conductive layers WL1 to WL4 one another. Accordingly, when the layer number of the conductive layers WL1 to WL4 is n (n is a natural number), the layer number of the insulator layers 14 is (n+1). Although the layer number n of the conductive layers WL1 to WL4 is optional, n is 4 in this embodiment.

An insulator layer 15 is provided on the stacked body ML2, and thereon an upper select-gate USG is provided, and thereon an insulator layer 16 is provided. The insulator layers 15, 16 are, for example, silicon oxide layers, and the upper select-gate USG is, for example, a silicon layer. A stacked body ML3 is composed of the insulator layer 15 and the upper select-gate USG and the insulator layer 16.

Hereinafter, in this specification, for the convenience of the description, an XYZ orthogonal coordinate system(Cartesian coordinate system) is introduced. In this coordinate system, two directions parallel to the upper surface (main surface) of the silicon substrate 11 and orthogonal to each other are X direction and Y direction, and the direction orthogonal to both of X direction and Y direction, namely, the stacking direction of the insulator layers 14 and the conductive layers WL1 to WL4 is Z direction.

As shown in FIG. 1, the layer provided in a more upper part of the conductive layers WL1 to WL4 has a shorter length in the X direction. When viewed from above (+Z direction), the conductive layers WL1 to WL4 broaden in plate shapes inside the lower select-gate LSG and the cell source CS that are provided in the part lower than the conductive layers. Moreover, the upper select-gate USG is located inside the upper-most conductive layer WL4. Accordingly, the ends of the stacking body from the cell source CS to the upper select-gate USG have a stepwise manner.

The stacked body ML1, the stacked body ML2, and the stacked body ML3 (hereinafter, genetically also referred to as "stacking body ML") are provided so as to be divided into a plurality of blocks along the Y direction.

The upper select-gate USG is formed by one plate-like conductive layer (for example, amorphous or polycrystalline silicon layer) segmented to the plural along the Y direction, and is a conductive material having a plurality of wire shapes extending in the X direction.

The conductive layers WL1 to WL4 and the lower select-gate LSG are plate-like conductive layers parallel to the XY plane. Moreover, the cell source CS is one plate-like conductive layer parallel to the XY plane so as to link the plurality of blocks immediately below the stacked bodies ML.

For the stacked body ML, a plurality of through-holes extending through the entire stacked bodies ML in the stacking direction (Z direction) are formed. The plurality of through-holes are arranged, for example, in a matrix configuration along the X direction and the Y direction, and the arrangement period is constant in each of the X direction and the Y direction.

Inside each of the though-holes, a silicon pillar SP is buried as a columnar semiconductor layer. The silicon pillar SP is formed from polycrystalline silicon or amorphous silicon that is doped with impurities or non-doped. The shape of the silicon pillar SP is a columnar shape extending in the Z direction, and for example, a circular cylindrical shape. Moreover, the silicon pillar SP is provided over the entire length of the stacking direction of the stacked bodies ML, and the lower end thereof is connected to the cell source CS.

Moreover, on the stacked body ML3, an insulator layer 18 is provided, and on the insulator layer 18, a plurality of bit lines BL extending in the Y direction are provided. The bit lines BL are formed from, for example, a metal material. In this specification, "metal" includes alloys in addition to pure metals.

Each of the bit lines BL is arranged so as to pass immediately above each row of the silicon pillars SP arranged along the Y direction, and connected to the upper ends of the silicon pillars SP through a via-hole 18a formed in the insulator layer 18. That is, each row of the silicon pillars SP extending in the Y direction is connected to the different bit line BL. Each of the silicon pillars SP is connected between the bit line BL and the cell source CS.

In the −X direction side of the region in which the bit lines BL are arranged, a plurality of upper select-gate lines (USL) extending in the X direction are provided. The upper select-gate line USL is formed from, for example, a metal material. The number of the upper select-gate lines USL is the same as the number of the upper select-gates USG.

In the +X direction side of the region in which the bit line BL are arranged, for each of blocks of the stacked bodies ML, a plurality of word lines WLL extending in the X direction, one lower select-gate line LSL extending in the X direction, and one cell source line CSL extending in the X direction are provided. The word lines WLL, the lower select-gate line LSL, and the cell source line CSL are formed from, for example, metal material.

The number of the word lines WLL corresponding to one stacked body ML is the same as the number of the conductive layers WL1 to WL4, and each of the word lines WLL are connected to each of the conductive layers WL1 to WL4 through a via 21. Moreover, the lower select-gate line LSL is connected to the lower select-gate LSG through a via 22, and the cell source lines CSL are connected to the cell source CS through a contact 23. The vias 21, 22, and the contact 23 are formed in the region departing from the memory cell region provided with the silicon pillars to the +X direction side.

The lines are insulated from each other by interlayer insulation films, which are not shown.

In the inner circumferential wall of the through-hole formed in the stacked body ML2 composed of the stacked structure of the conductive layer WL1 to WL4 and the insulator layers 14, as shown in FIG. 2, a first insulator film 27, a charge trap layer 26, and a second insulator film 25 are formed in tubular shapes, respectively. Inside the first insulator film 27, the silicon pillar SP is buried. The first insulator film 27 is in contact with the silicon pillar SP, and the second insulator film 25 is in contact with the conductive layers WL1 to WL4 and the insulator layers 14. Between the first insulator film 27 and the second insulator film 25, the charge trap layer 26 is provided.

The silicon pillar SP provided in the stacked body ML2 functions as a channel, and the conductive layers WL1 to WL4 function as a control gate, and the charge trap layer 26 functions as a data memory layer accumulating charge injected from the silicon pillar SP. That is, in the crossover parts of the silicon pillar SP and the conductive layers WL1 to WL4, memory cells MC1 to MC4 having an SGT (Surrounding Gate Transistor) structure in which the surrounding part of the channel is surrounded by the gate electrodes are formed.

The memory cells MC1 to MC4 are memory cells each having a charge trap structure, and the charge trap layer 26 has many traps for blocking in charge (electron) and is made of, for example, silicon nitride film.

The first insulator film 27 is made of, for example, silicon oxide film, and becomes a potential barrier when charge is injected into the charge trap layer 26 from the silicon pillar SP or when charge trapped in the charge trap layer 26 diffuses into the silicon pillar SP.

The second insulator film 25 is made of, for example, silicon oxide film, and prevents the charge trapped in the charge trap layer 26 from diffusing into the conductive layers WL1 to WL4 functioning as the gate electrodes.

As memory cells MC1 to MC4 having the above-described structures become finer, normal writing/reading operation can be performed without having a diffusion layer serving as the source/drain region. Accordingly, in this embodiment, the memory cells MC1 to MC4 do not have a diffusion layer as the source/drain region having a different conductive type in the silicon pillar SP. That is, the silicon pillar SP functions as a channel region, a source region, and a drain region in the memory cells MC1 to MC4. Moreover, by controlling the voltage applied to the conductive layers WL1 to WL4, the inside of the silicon pillar SP opposed to the conductive layers WL1 to WL4 can be approximately depleted, and thereby the OFF state is realized.

As shown in FIG. 3, around one silicon pillar SP, the memory cells MC1 to MC4 having the same number as the conductive layers WL1 to WL4 are serially connected in the Z direction, and thereby, one memory string is composed. Such memory strings are arranged in the matrix shape in the X direction and the Y direction, and thereby, a plurality of memory cells are arranged three-dimensionally in the X direction, the Y direction, and the Z direction.

With reference to FIG. 2 again, in the inner circumferential wall of the through-hole formed in the stacked body ML1 that is a layer lower than the stacked body ML2, a gate insulator film GD is formed in a tubular shape, and inside the gate insulator film GD, a silicon pillar SP is buried. Thereby, in the stacked body ML1, a lower selection transistor LST in which the silicon pillar SP serves as a channel and the lower select-gate LSG around the silicon pillar SP serves as the gate electrode is provided.

Moreover, in the inner circumferential wall of the through-hole formed in the stacked body ML3 that is a layer upper than the stacked body ML2, the gate insulator film GD is formed in a tubular shape, and inside the gate insulator film GD, a silicon pillar SP is buried. Thereby, in the stacked body ML3, a upper selection transistor UST in which the silicon pillar SP serves as a channel and the upper select-gate USG around the silicon pillar SP serves as the gate electrode is provided.

Each of the lower selection transistor LST and the upper selection transistor UST has an SGT structure that is the same as the above-described memory cells MC1 to MC4, however does not function as a memory cell but functions selecting the silicon pillar SP.

Furthermore, in the semiconductor memory device according to this embodiment, there is provided a driver circuit for applying potential to the upper end of the silicon pillar SP through the bit line BL, a driver circuit for applying potential to the lower end of the silicon pillar SP through the cell source line CSL and contact 23 and the cell source CS, a driver circuit for applying potential to the upper select-gate USG through the upper select-gate line USL and the via 20, a driver circuit for applying potential to the lower select-gate LSG through the lower select-gate Line LSL and the via 22, and a driver circuit for applying potential to each of the conductive layers WL1 to WL4 through the word lines WLL and the vias 21 (which are not shown). In a circuit region in which each of the driver circuits is formed, a P well and an N well (not shown) are formed, and an element such as a transistor is formed in the wells.

The semiconductor memory device according to this embodiment is a nonvolatile semiconductor memory device by which erasing and writing of data can be electrically performed freely and the memory contents can be held even when the power is shut off.

The X coordinate of the memory cells is selected by selecting a bit line BL, and the Y coordinate of the memory cells is selected by selecting the upper select-gate USG to make the upper selection transistor UST be in a conduction state or in a non-conduction state, and the Z coordinate of the memory cells is selected by selecting the conductive layers WL1 to WL4 as the word line. And, information is recorded by injecting electron into the charge trap layer 26 of the selected memory cell. Moreover, by a sense current flowing through a silicon pillar SP passing through this memory cell, the information recorded in this memory cell is read.

Next, with reference to FIGS. 4A to 10, a method for manufacturing the semiconductor memory device according to the embodiment of the invention will be described.

Figure 4A:
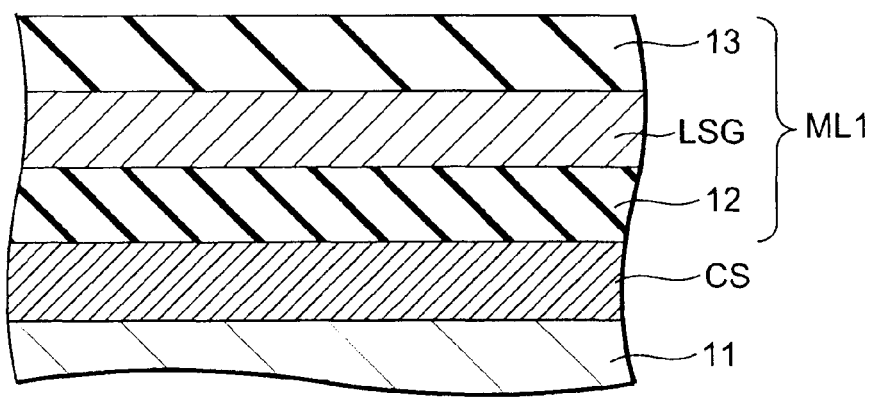
FIGS. 4A to 4C are schematic views illustrating a method for manufacturing the semiconductor memory device according to the first embodiment of the invention.

First, impurities are introduced into a memory array region in a silicon substrate 11, and as shown in FIG. 4A, the cell source CS is formed. On the other hand, P well and N well and so forth are formed in the peripheral circuit region (not shown), and sources and drains of transistors composing each of the driver circuits and further gates of the transistors are formed.

The insulator layer 12 on the cell source CS, and thereon, a silicon layer serving as the lower select-gate LSG, and furthermore thereon, the insulator layer 13 is formed. Thereby, the stacked body ML1 composed of the insulator layer 12 and the lower select-gate LSG and the insulator 13 is formed.

Figure 4B:
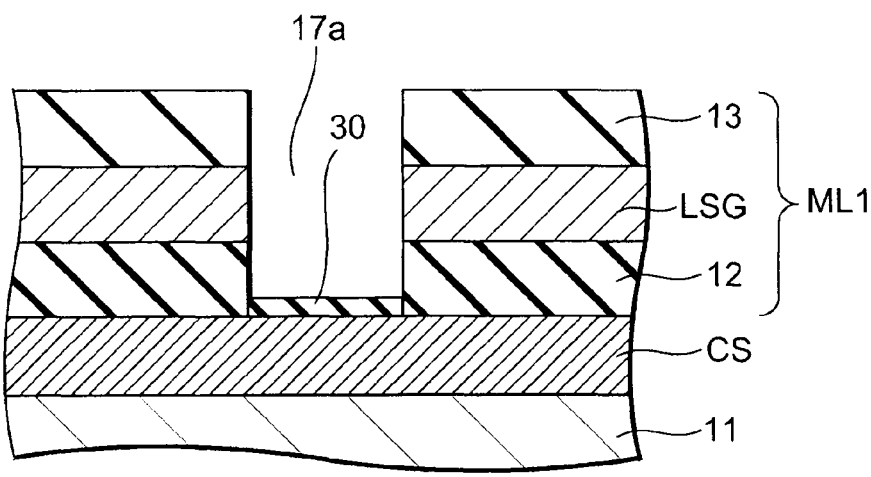

As shown in FIG. 4B, in the stacked body ML1, the through-hole 17a extending in the Z direction (the stacking direction) and reaching the cell source CS is formed by etching. In this case, a plurality of through holes 17a are formed at the same time so as to be arranged in matrix configuration as viewed from the Z direction. In this case, in the bottom surface of the through-hole 17a, the cell source CS is once exposed, but a silicon oxide film 30 such as a natural oxide film is formed on the exposed surface thereof.

Figure 4C:
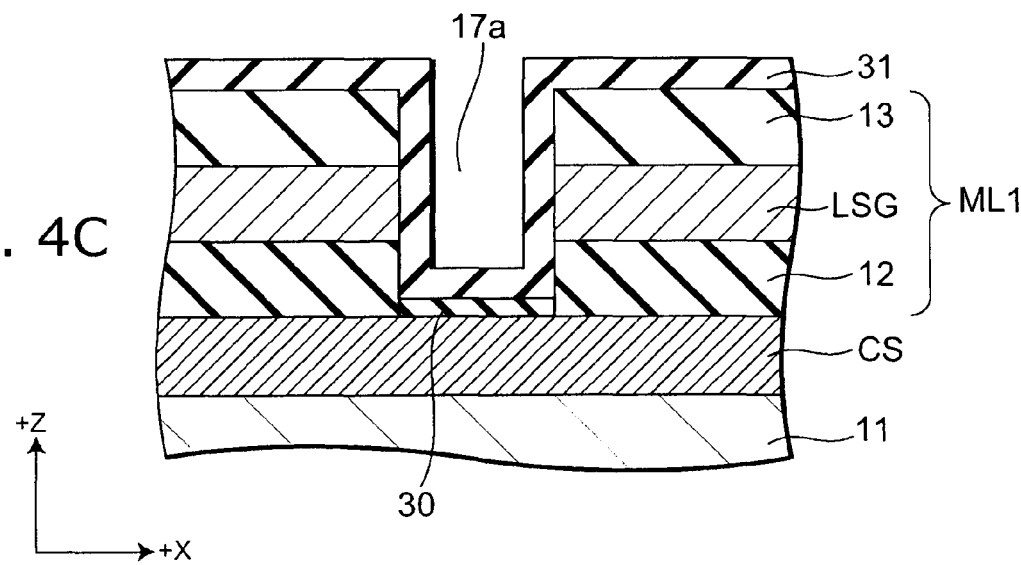

As shown in FIG. 4C, on the entire surface of the stacked body ML1, a silicon nitride film 31 is deposited. The silicon nitride film 31 is also formed on the bottom surfaces and the side surfaces of the through-holes 17a in addition to the upper surface of the stacked body ML1.

Figure 5A:
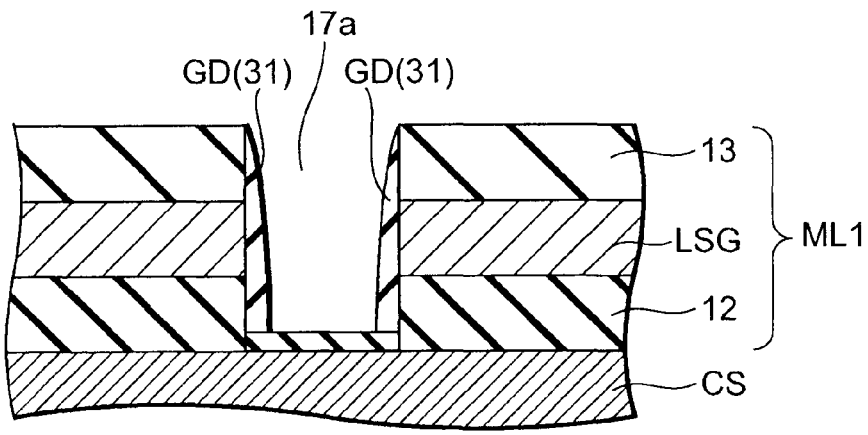
FIGS. 5A to 5C are schematic views showing processes following FIG. 4C.

For example, by RIE (Reactive Ion Etching), the silicon nitride film 31 formed on the upper surface of the stacked body ML1 and the bottom surfaces of the through-holes 17a is removed. Thereby, as shown in FIG. 5A, a silicon nitride film 31 is left in the side surfaces of the through-holes 17a, and becomes the gate insulator film GD.

Figure 5B:
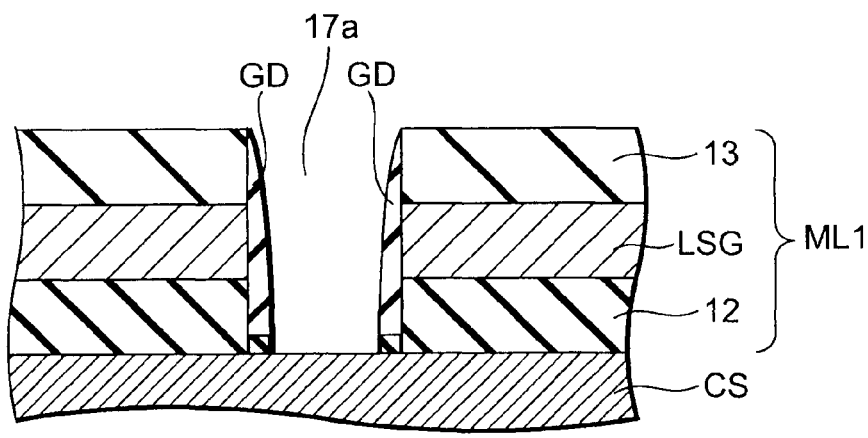

For example, by wet etching with dilute fluorinated acid, as shown in FIG. 5B, the silicon oxide film 30 such as a natural oxide film is removed from the bottom surfaces of the through-holes 17a, and the cell source CS is exposed to the bottom surfaces of the through-holes 17a.

Figure 5C:
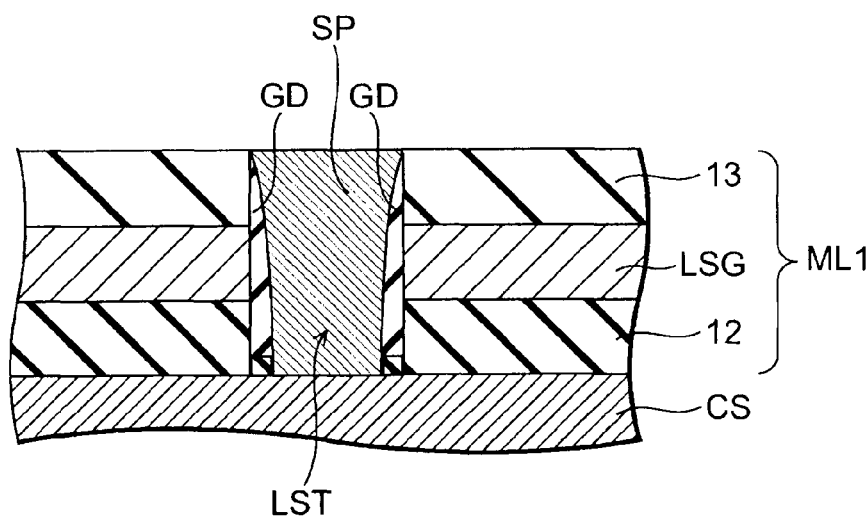

As shown in FIG. 5C, silicon is buried inside the through-holes 17a, and the silicon pillars SP are formed in the through-holes 17a. Thereby, the lower selection transistor LST is formed.

Figure 6:
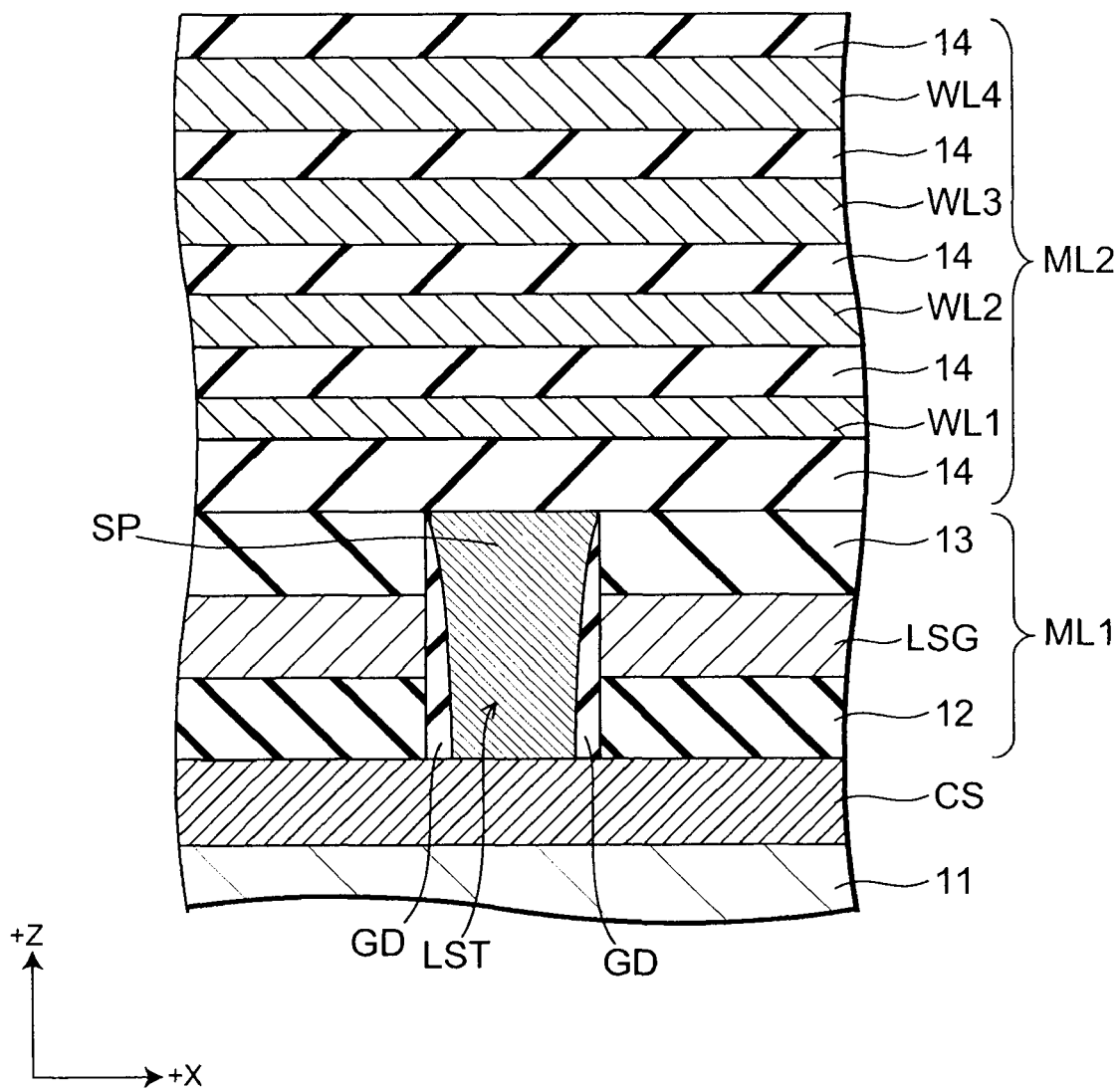
FIG. 6 is a schematic view showing a process following FIG. 5C.

As shown in FIG. 6, on the stacked body ML1, the insulator layers 14 and the conductive layers WL1 to WL4 are alternately stacked to form the stacked body ML2. For example, five insulator layers 14 made of silicon oxide and four conductive layers WL1 to WL4 made of amorphous or polycrystalline silicon are alternately film-formed.

In this case, in this embodiment, the layer thickness of lower conductive layer is set to be thinner. In the example shown in FIG. 6, the lowermost conductive layer WL1 is the thinnest, and the upper layers of the conductive layer WL2 that is the second layer from the bottom, the conductive layer WL3 that is the third layer from the bottom, and the conductive layer WL4 that is the uppermost layer are formed thicker in the stepwise manner. The thicknesses of the insulator layers 14 are optional.

Figure 7:
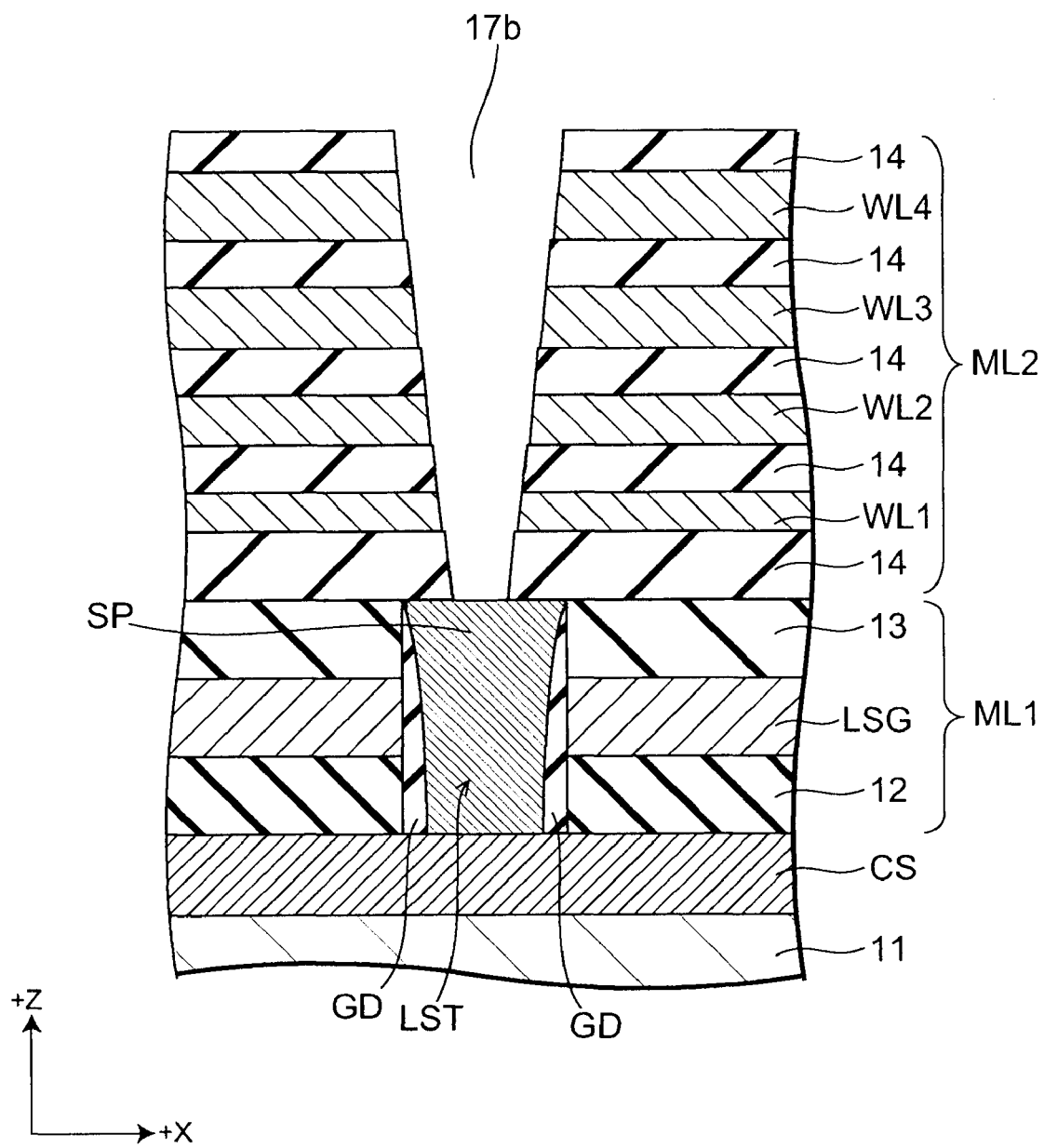
FIG. 7 is a schematic view showing a process following FIG. 6.

As shown in FIG. 7, the through-hole 17b extending in the Z direction and reaching the silicon pillar SP of the stacked body ML1 is formed in the part immediately above the silicon pillar SP of the stacked body ML1.

The through-hole 17b is formed by RIE. On the current process, in particular when the aspect ratio is large, the diameter of the through-hole 17b does not become constant in the depth direction, but becomes narrower from the upper part of the opening end side to the lower part (the bottom part). More specifically, in the side surface of the through-hole 17b, slight steps are formed in the boundaries of the respective layers, and the through-hole 17b becomes narrower in a stepwise manner from the upper part to the lower part. Moreover, the side surface of the through-hole 17b, namely, the side surface of the insulator layers 14 and the conductive layers WL1 to WL4 exposed to the inside of the through-hole 17b, is provided with a taper so as to be nearer to the center of the radial direction of the through-hole 17b in the lower layer side.

Figure 8:
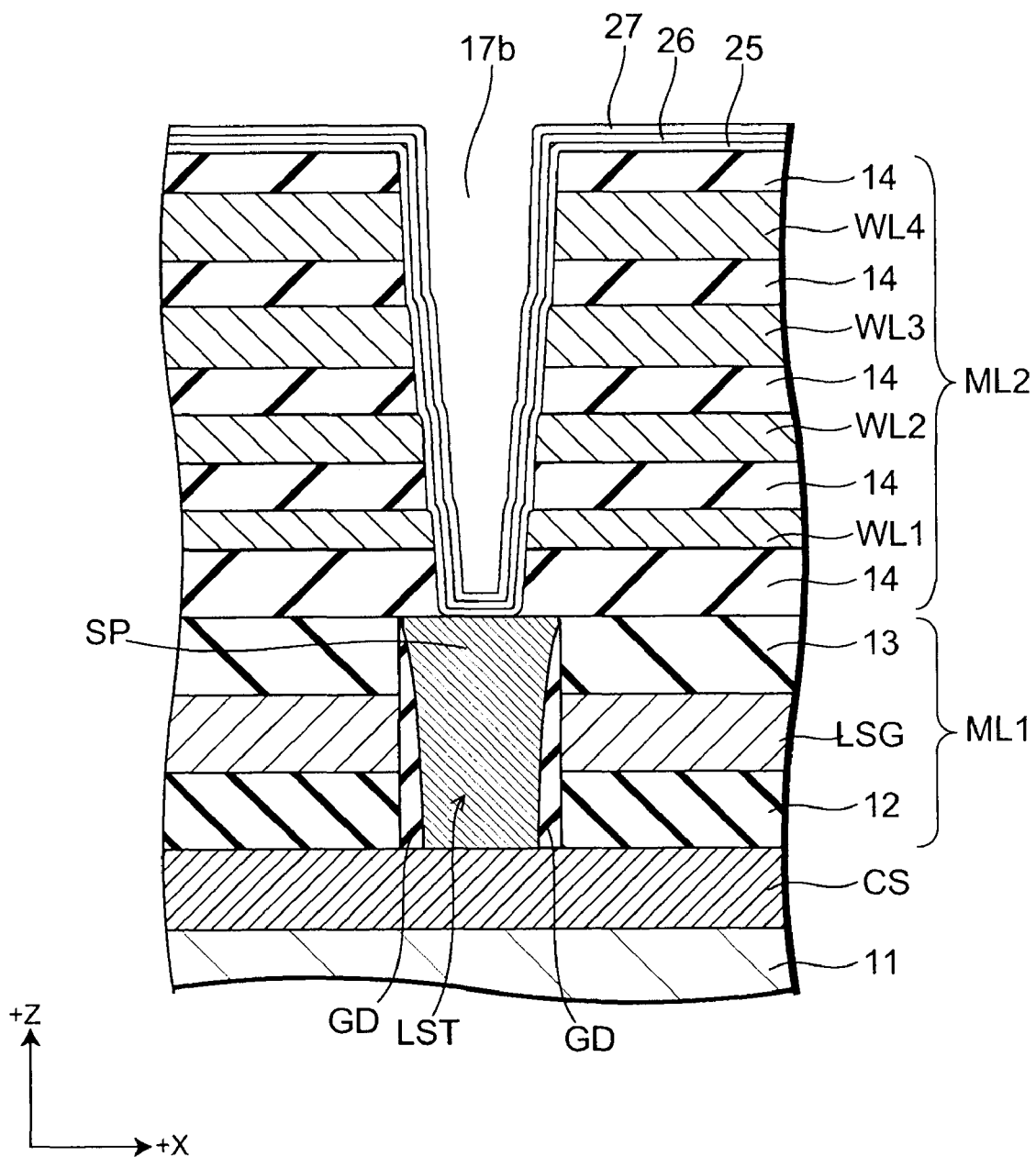
FIG. 8 is a schematic view showing a process following FIG. 7.

After forming the though-hole 17b, on the entire surface of the stacked body ML2, as shown in FIG. 8, the first insulator film 25, the charge trap layer 26 and the second insulator film 27 are formed in this order. These films are formed on the bottom surfaces and side surfaces of the through-holes 17b in addition to the upper surface of the stacked body ML2.

The first insulator film 25, the charge trap layer 26 and the second insulator film 27 formed on the upper surface of the stacked body ML2 and the bottom surfaces of the through-holes 17b are removed. Thereby, only on the side surfaces of the through-holes 17b, the first insulator film 25, the charge trap layer 26 and the second insulator film 27 are left.

Figure 9:
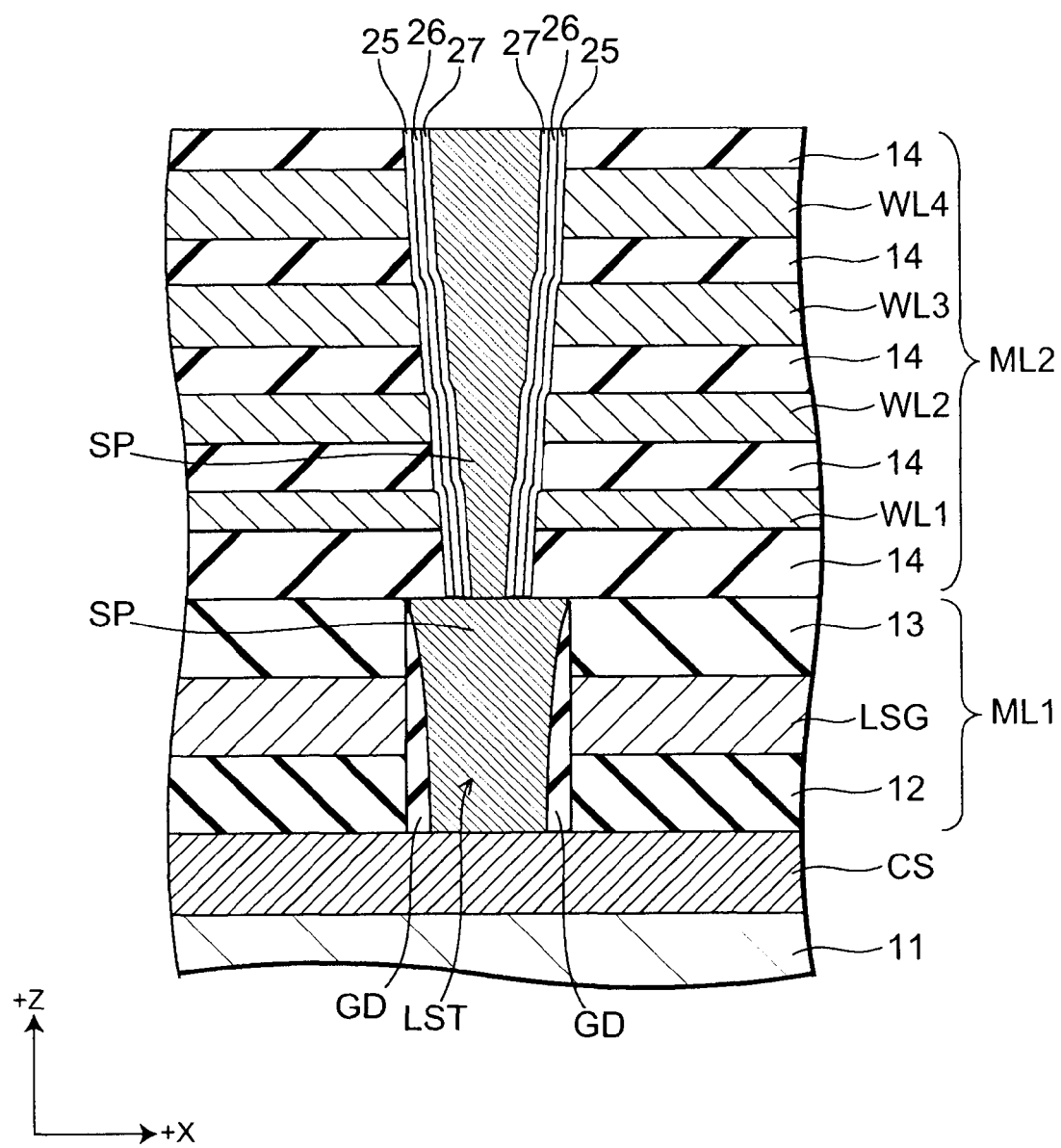
FIG. 9 is a schematic view showing a process following FIG. 8.

And, as shown in FIG. 9, by burying silicon inside the through-holes 17b, the silicon pillars SP in the stacked body ML2 are formed. Thereby, the memory cells each having an SGT structure are formed at the crossover parts of the silicon pillar SP and the conductive layers WL1 to WL4. The lower end of the silicon pillar SP of the stacked body ML2 is in contact with the upper end of the silicon pillar SP of the stacked body ML1. The silicon pillar SP formed on the stacked body ML2 is formed narrower in the stepwise manner from the upper part to the lower part so as to be adapted to the through-hole 17b.

After forming the resist film (not shown) on the stacked body ML2, RIE is performed so that the resist film serves as a mask, and pattering the insulator layers 14 and the conductive layers WL1 to WL4 sequentially from the uppermost layer side and ashing the resist film to be one size smaller (sliming) are alternately repeated to process the ends of the stacked ML2 in the stair-like pattern as shown in FIG. 1.

Figure 10:
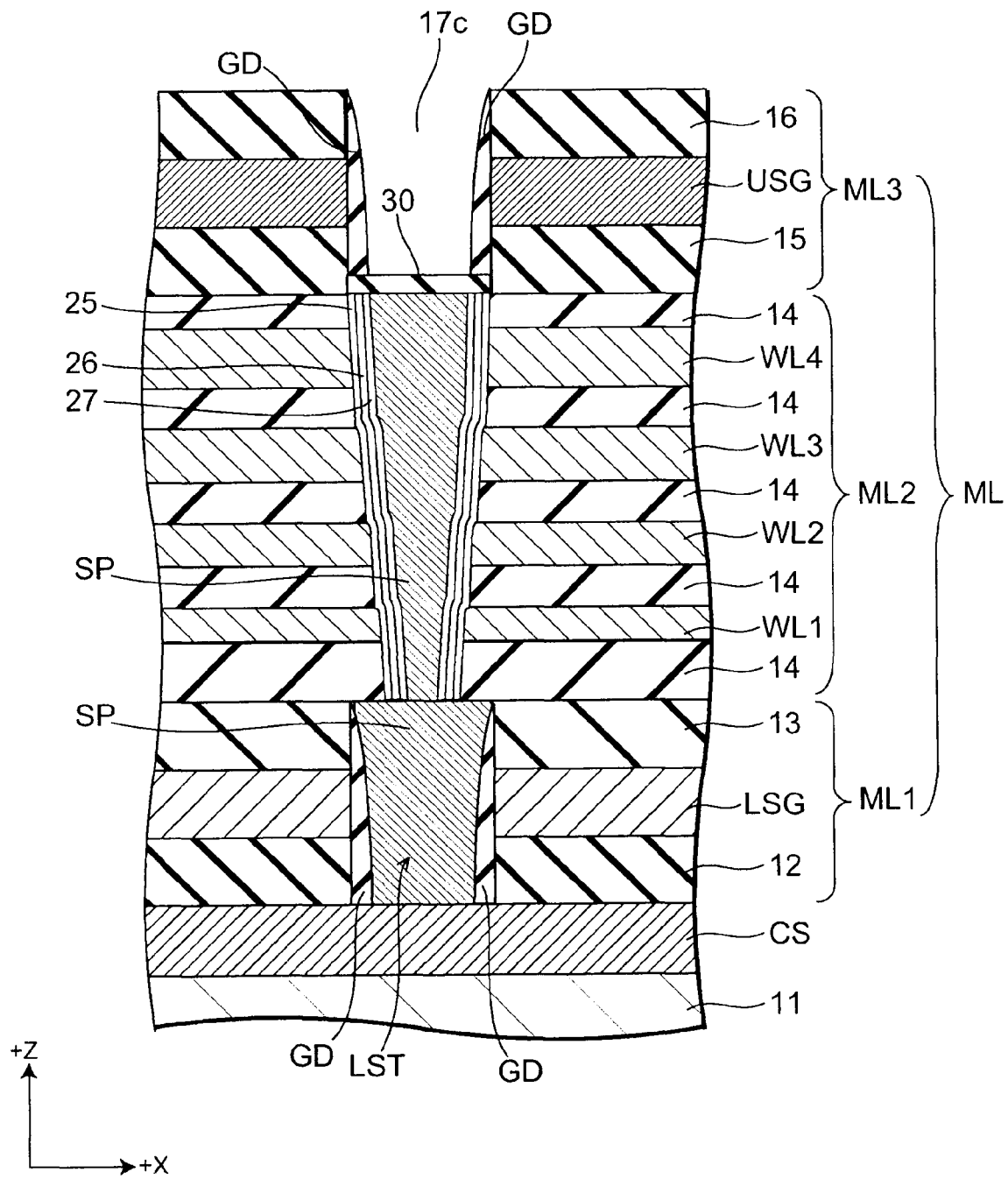
FIG. 10 is a schematic view showing a process following FIG. 9.

As shown in FIG. 10, the insulator layer 15 is formed on the stacked body ML2, and thereon, a silicon layer serving as the upper select-gate USG is formed, and furthermore, thereon, the insulator film 16 is formed. Thereby, the stacked body ML3 composed of the insulator layer 15, the upper select-gate USG and the insulator layer 16 is formed.

In the stacked body ML3, through-holes 17c each extending in the Z direction (the stacking direction) and reaching the silicon pillar SP of the stacked body ML2 are formed by etching. In this case, in the bottom surfaces of the through-holes, the upper surfaces of the silicon pillar SP of the lower layer are once exposed, but on the exposed surface, a silicon oxide film 30 such as a natural oxide film is formed.

On the entire surface of the stacked body ML3, a silicon nitride film is deposited. This silicon nitride film is formed on the bottom surfaces and the side surfaces of the through-holes 17c in addition to the upper surface of the stacked body ML3.

For example, by RIE, the silicon nitride film formed on the upper surface of the stacked body ML3 and the bottom surfaces of the through-holes 17c is removed. Thereby, as shown in FIG. 10, the silicon nitride film is left in the side surfaces of the through-holes 17c, and becomes the gate insulator film GD.

For example, by wet etching with dilute fluorinated acid, the silicon oxide film 30 such as a natural oxide film is removed from the bottom surfaces of the through-holes 17c to make the silicon pillar layers of the stacked body ML2 exposed to the bottom surfaces of the through-holes 17c.

As shown in FIG. 2, silicon is buried inside the through-holes 17c, and the silicon pillars SP are formed in the through-holes 17c. Thereby, the upper selection transistor UST is formed. The lower end of the silicon pillar SP of the stacked body ML3 is in contact with the upper end of the silicon pillar SP of the stacked body ML2.

After forming the insulator layer 18 on the stacked body ML3, the vias 18a are formed in the insulator layer 18. A metal film is formed on the entire surface and patterned, and thereby, bit lines BL are formed. Furthermore, the upper select-gate line USL, the word line WLL, the lower select-gate line LSL, and the cell source line CSL are formed, and thereby, the structure shown in FIG. 1 can be obtained.

According to this embodiment, as described above, the silicon pillar SP in the stacked body ML2 functioning as a channel of the memory cell transistor is not formed with the same diameter from the upper part to the lower part, but has a shape of becoming narrower in the lower part. There is a correlation between the diameter of the silicon pillar SP and an S factor of the memory cell transistor.

Here, the S factor represents switching characteristics that becomes a rough indication of how rapidly ON/OFF of the transistor can be switched, and is defined as a gate voltage required for enhancing the element current by a single order. In the smaller S factor, the switching characteristics are more excellent.

The memory cell formed in a part of the narrow silicon pillar SP tends to have a smaller S factor than the memory cell formed in a part having the thicker pillar diameter. Accordingly, variation of the switching characteristics is caused between the upper-layer-side memory cell transistor and the lower-layer-side memory cell transistor, and the design difficulty level for obtaining desired characteristics as the entire semiconductor memory device comes to increase.

However, in this embodiment, the conductive layers WL1 to WL4 functioning as the control gates are formed so as to be thinner in a stepwise manner from the uppermost WL4 to the lowermost WL1. The layer thicknesses of the conductive layers WL1 to WL4 correspond to the gate lengths, and as the gate length is shorter, namely as the conductive layer is thinner, the S factor has a tendency of being larger.

In this embodiment, when only the correlation between the diameter of the silicon pillar SP and the S factor is noticed, the S factor of the lower layer side is smaller than that of the upper layer side, but when only the correlation between the layer thickness (gate length) of each of the conductive layers WL1 to WL4 and the S factor is noticed, the S factor of the lower layer side is larger than that of the upper layer side. That is, in this structure, variation of the S factor among different layers due to diameter of the silicon pillar SP is cancelled by making the thickness of each of the conductive layers WL1 to WL4 thinner with the lower layer side.

When the conductive layer is thinner (the gate length is shorter) with the memory cell formed in the part having a narrower diameter of the silicon pillar SP and the conductive layer is thicker (the gate length is longer) with the memory cell formed in the part having a thicker diameter of the silicon pillar SP, the S factors of the memory transistors between the lower layer side and the upper layer side can be substantially uniformed, and the design becomes easy.

If a comparative example is that the diameter of the silicon pillar SP is the upper diameter of the opening end side of the though-hole that is almost constant without considering that the pillar diameter of the lower layer side becomes thinner, in this embodiment, with considering that the pillar layer of the lower layer side is narrower, the conductive layer of the lower layer side is set to be thinner according to the narrower pillar diameter. Therefore, when the thickness of the entire stacked body ML2 is the same as the case of the comparative example, because the conductive layer of the lower layer side is set to be thinner in this embodiment, further increase of the layer number of the conductive layers, namely, multi-stratification of the memory cells can be achieved, and enlargement of memory capacity can be realized.

Moreover, it is also possible that the thickness (gate length) of the lowermost conductive layer WL1 determined to obtain the desired S factor according to diameter of the silicon pillar SP of the lowermost memory cell is set to be the minimum value, and based on the value, the thicknesses of the conductive layers WL2 to WL4 of the upper layers may be set to be longer sequentially in a stair-like pattern.

Figure 11:
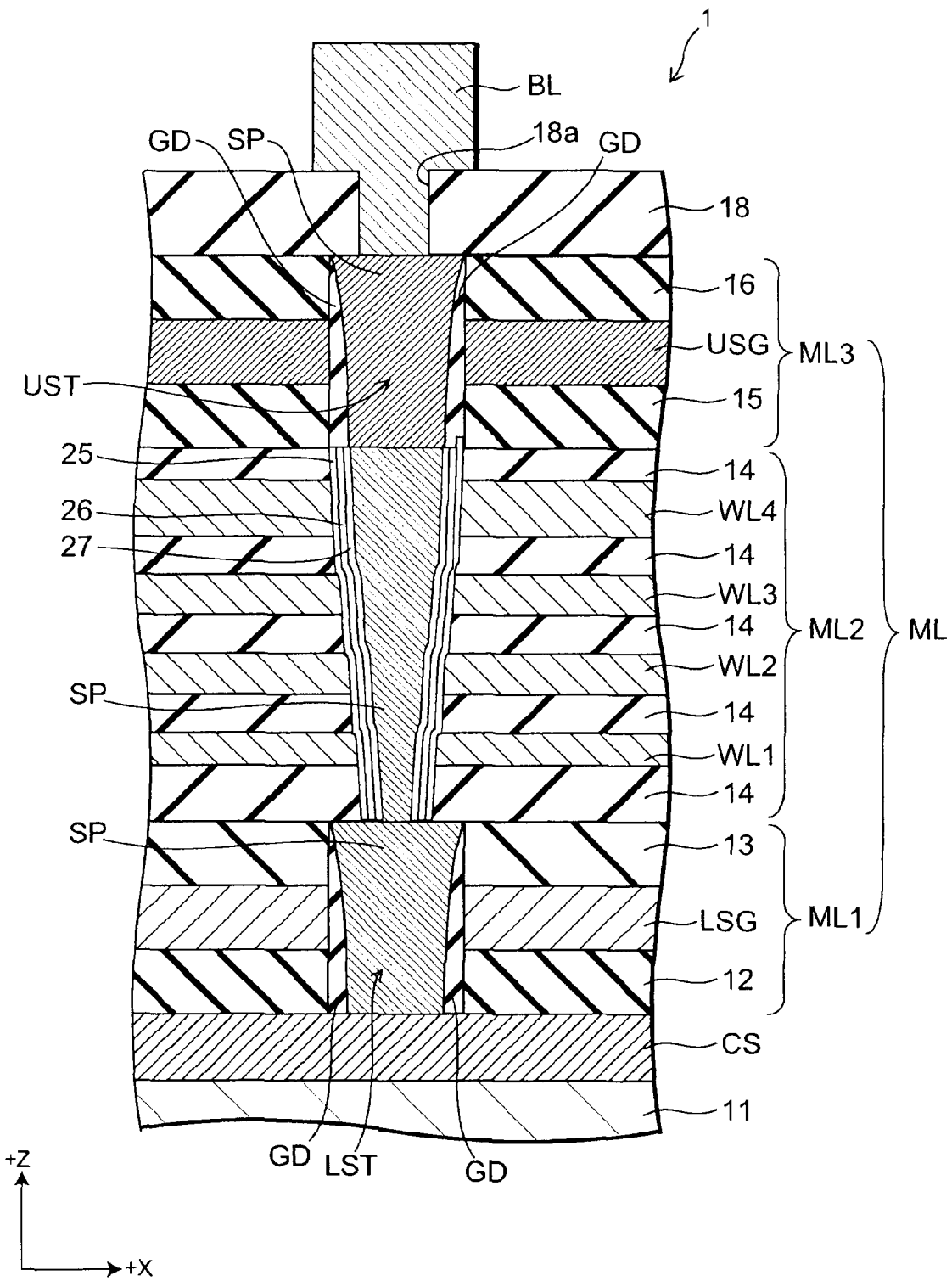
FIG. 11 is a schematic view showing a modification of the structure in FIG. 2.
Figure 12:
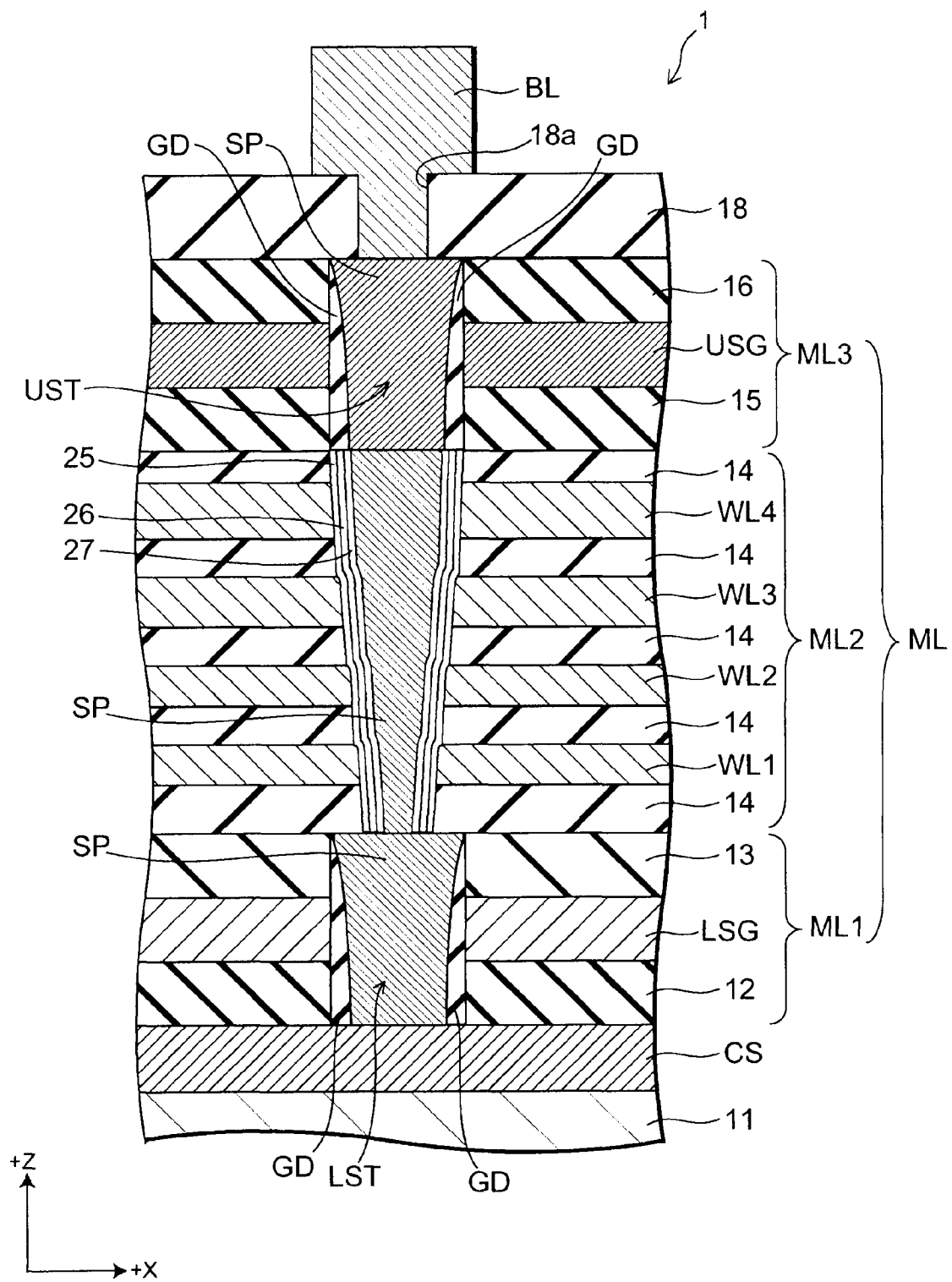
FIG. 12 is a schematic view showing another modification of the structure in FIG. 2.
Figure 13:
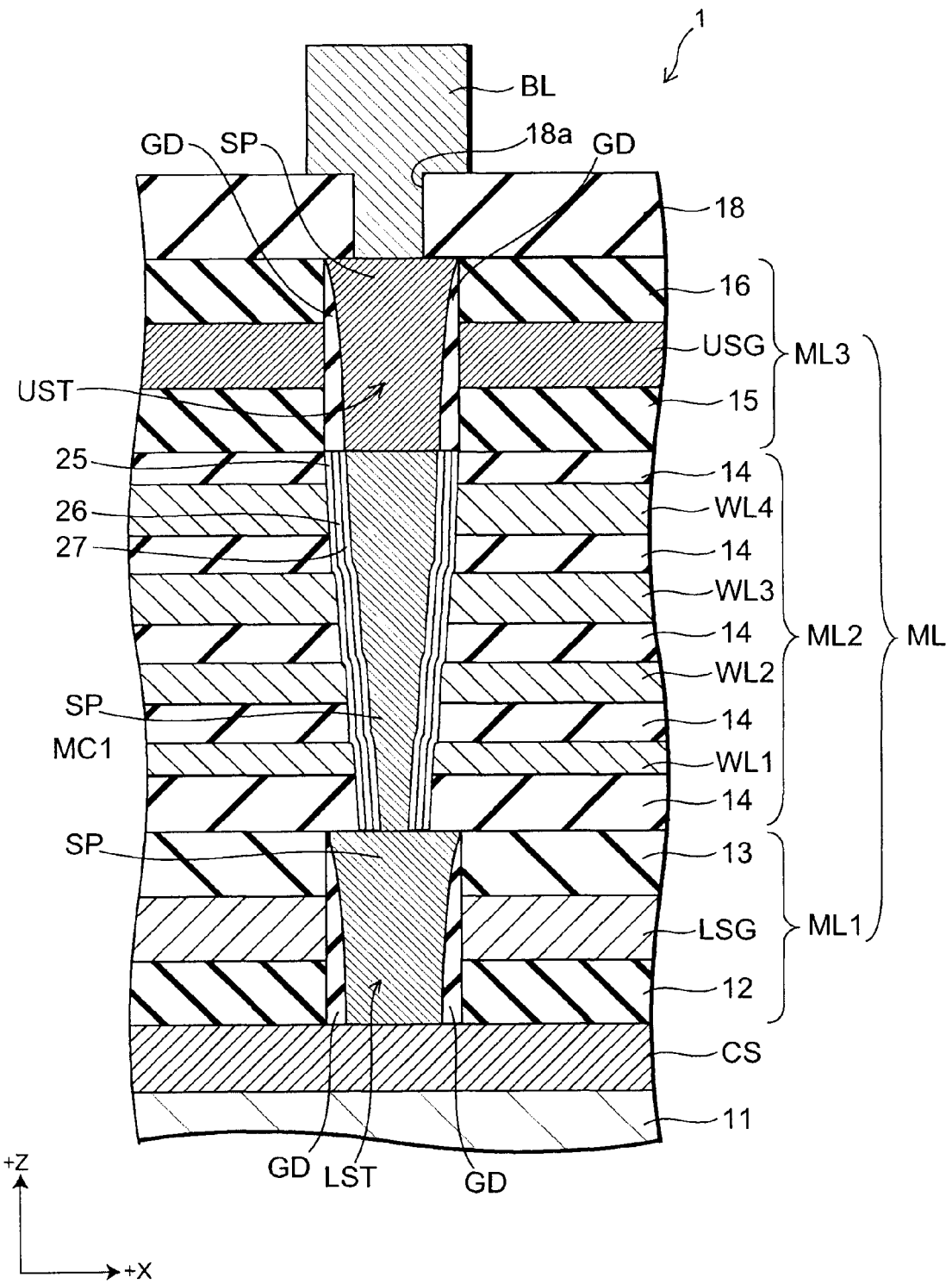
FIG. 13 is a schematic view showing still another modification of the structure in FIG. 2.

In the plurality of the conductive layers WL1 to WL4, at least when the thickness relation between the lowermost layer and the uppermost layer corresponding to the parts having the largest pillar diameter difference is a relation that the lowermost layer is thinner than the uppermost layer, the effect can be obtained in suppressing the variation of the switching characteristics of the memory cells among the different layers. Therefore, the thicknesses of all of the conductive layers are not necessarily different from each other. For example, between the vertically contiguous layers having relatively small pillar diameter difference, the conductive layers may be set to have the same thickness. For example, as shown in FIG. 11, the second conductive layer WL2 and the third conductive layer WL3 may be set to have the same thickness, and as shown in FIG. 12, the first conductive layer WL1 and the second conductive layer WL2 may be set to have the same thickness, or as shown in FIG. 13, the third conductive layer WL3 and the fourth conductive layer may be set to have the same thickness.

When the thickness of the conductive layer with respect to the diameter of the silicon pillar SP in each of the memory cell is individually adjusted according to the target size, variation of the switching characteristics of memory cells among the layers can be suppressed more efficiently.

Second Embodiment

Figure 14:
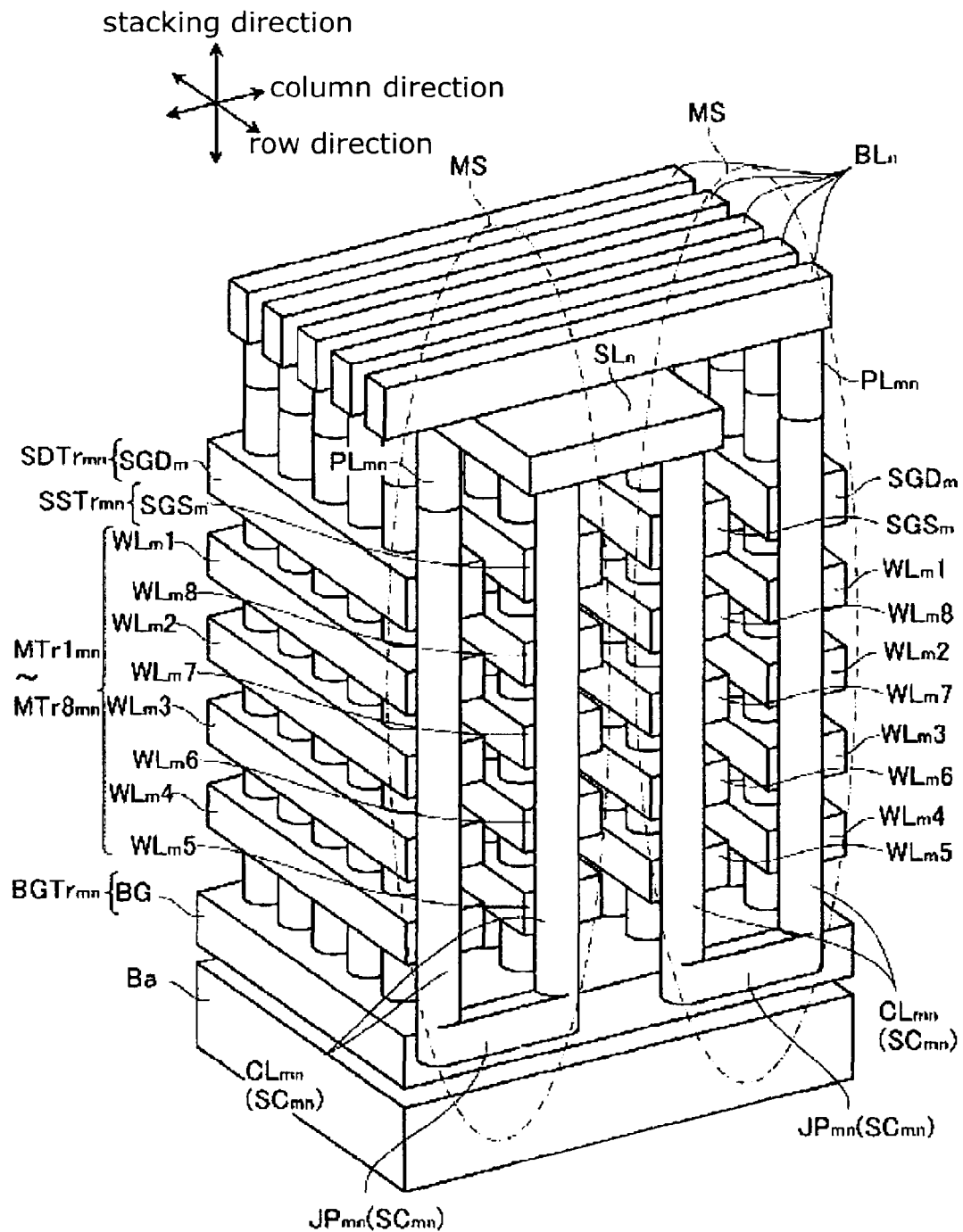
FIG. 14 is a schematic perspective view illustrating a semiconductor memory device according to a second embodiment of the invention.

FIG. 14 is a schematic perspective view of part of a memory transistor region in a nonvolatile semiconductor memory device according to a second embodiment of the invention.

The nonvolatile semiconductor memory device according to this embodiment has m×n memory strings MS (m and n are natural numbers) including, memory transistors MTr1$mn$ to MTr8$mn$, source-side selection transistors SSTrmn, and drain-side selection transistors SDTrmn. In FIG. 14, the case of m=6 and n=2 is shown as an example. Moreover, in FIG. 15, a partial enlarged sectional view of FIG. 14 is shown.

Each of the memory strings MS has a configuration in which a plurality of electrically rewritable memory transistors MTr1$mn$ to MTr8$mn$ are serially connected. Each of the memory strings MS has a U-shaped semiconductor SCmn, word lines WLm1 to WLm8 which are conductive layers, a source-side select-gate line SGSm, a drain-side select-gate line SGDm, and a back gate line BG.

The U-shaped semiconductor SCmn is formed in a U shape when viewed from the row direction that is the extending direction of each of word lines WLm1 to WLm8. The U-shaped semiconductor SCmn has one pair of column parts CLmn extending to approximately vertical direction and a junction part JPmn formed so as to connect lower ends of the one pair of column parts CLmn.

Figure 15:
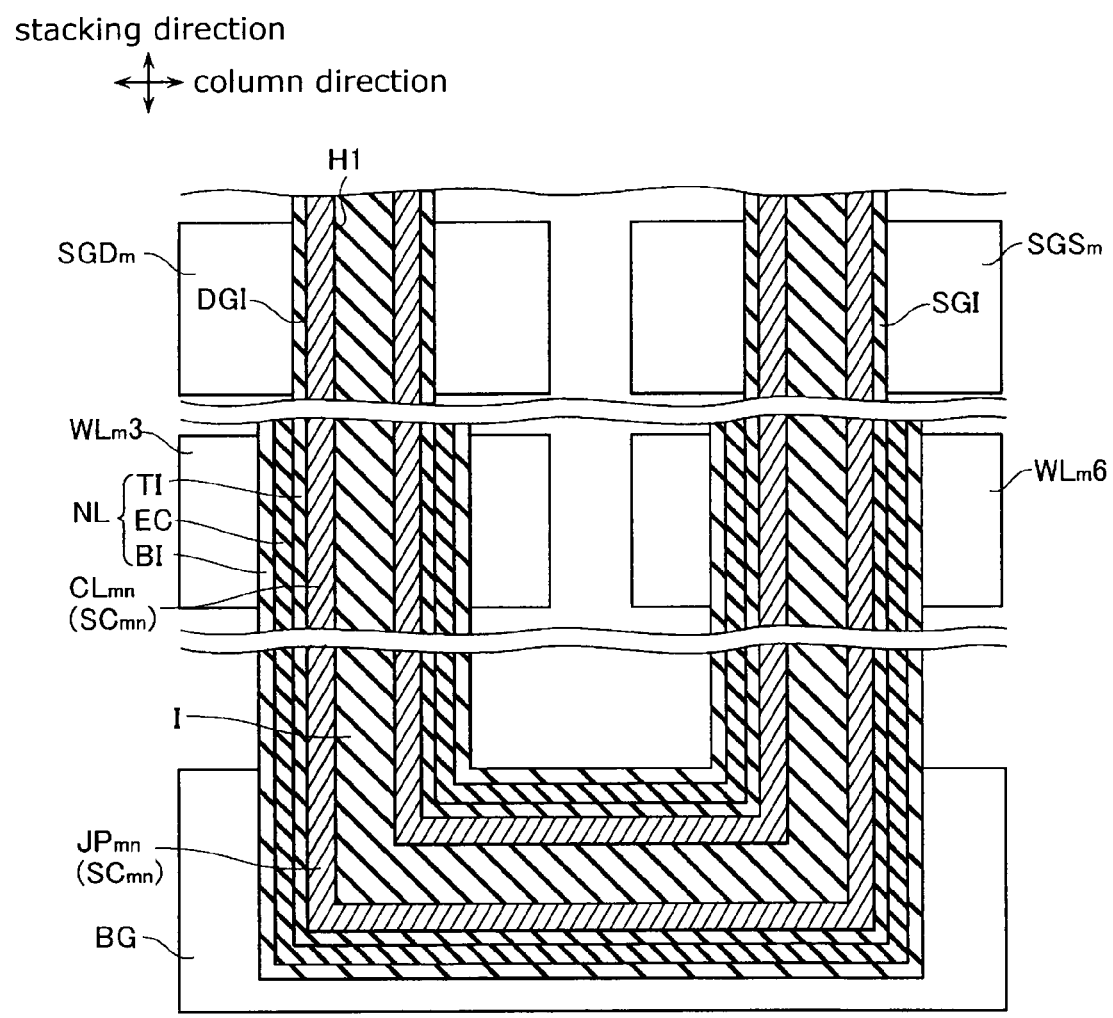
FIG. 15 is a principal cross-sectional view of the structure in FIG. 14.

Moreover, as shown in FIG. 15, the U-shaped semiconductor SCmn has a hollow part H1 communicated from the upper end of one column CLmn through the junction part JPmn to the upper end of the other column CLmn, and in the hollow part H1, an insulator part I is provided. The columnar part CLmn may have a circular cylinder shape or a rectangular cylinder shape. Moreover, the column part CLmn may have a columnar shape formed in a stepped shape.

The U-shaped semiconductor SCmn is provided so that straight lines each connecting the central axis of the one pair of column part CLmn are parallel to the column direction perpendicular to the stacking direction and the row direction. Moreover, the U-shaped semiconductor SCmn is disposed to have a matrix shape in the plane composed by the row direction and the column direction.

Each of the word lines WLm1 to WLm8 is formed in a line shape extending in parallel to the row direction. The word lines WLm1 to WLm8 are insulated and separated to one another and formed repeatedly in the column direction.

The gate of each of the memory transistors MTr1*mn* to MTr8*mn* disposed in the same position of the column direction and lining in the row direction is connected to the same one of the word lines WLm1 to WLm8. The ends in the row direction and the ends in the column direction of each of the word lines WLm1 to WLm8 are formed in a stair-like shape. Alternatively, the ends in the column direction of each of the word lines WLm1 to WLm8 are not limited to the stair-like shape, but may be formed to be uniform at predetermined positions of the column direction.

As shown in FIG. 15, between each of the word lines WLm1 to WLm8 and the column part of the U-shaped semiconductor SCmn, an ONO (Oxide-Nitride-Oxide) layer NL is formed. The ONO layer NL has a tunnel insulator layer TI contacting the column part CLmn, a charge trap layer EC contacting the tunnel insulator layer TI, and a block insulator layer BI contacting the charge trap layer EC.

The charge trap layer is made of, for example, silicon nitride having traps blocking in charge. The charge trap layer EC is formed so as to surround the side surface of the column part CLmn.

Moreover, each of the word lines WLm1 to WLm8 is formed so as to surround the side surface of the column part CLmn and the charge trap layer EC. Moreover, each of the word lines WLm1 to WLm8 are divided every column part CLmn adjacent in the column direction.

The drain-side select-gate line SGDm is provided above the word line WLm1, which is the uppermost layer. The drain-side select-gate line SGDm is formed in a line shape extending in the row direction. The drain-side select-gate lines SGDm are insulated and separated to one another and repeatedly formed in the column direction so as to sandwich the source-side select-gate lines SGSm. The column part CLmn is formed to pass through the center of the column direction in each of the drain-side select-gate lines SGDm. As shown in FIG. 15, between the drain-side select-gate line SGDm and the column part CLmn, a gate insulator layer DGI is formed.

The source-side select-gate line SGSm is provided above the word line WLm8, which is the uppermost layer. The source-side select-gate line SGSm is formed in a line shape extending in parallel in the row direction. The source-side select-gate lines SGSm are insulated and separated to one another and repeatedly formed in the column direction. The column part CLmn is formed to pass through the center of the column direction in the source-side selection gate lines SGSm. As shown in FIG. 15, between the source-side gate line SGSm and the column part CLmn, a gate insulator layer SGI is formed.

The back gate line BG is formed to two-dimensionally expand in the row direction and the column direction so as to cover the lower part of the junction part JPmn in the U-shaped semiconductor SCmn. As shown in FIG. 15, between the back gate line BG and the junction part JPmn, the above-described ONO layer NL is formed.

The upper end part above the source-side select-gate line SGSm in the column part CLmn of the U-shaped semiconductor SCmn is connected to a source line SLn.

The upper end of the column part CLmn extending above the drain-side select-gate line SGDm is connected to a bit line BLn thought a plug line PLmn. A plurality of bit lines BLn are formed repeatedly in a line shape extending in the column direction with predetermined intervals in the row direction.

Figure 16:
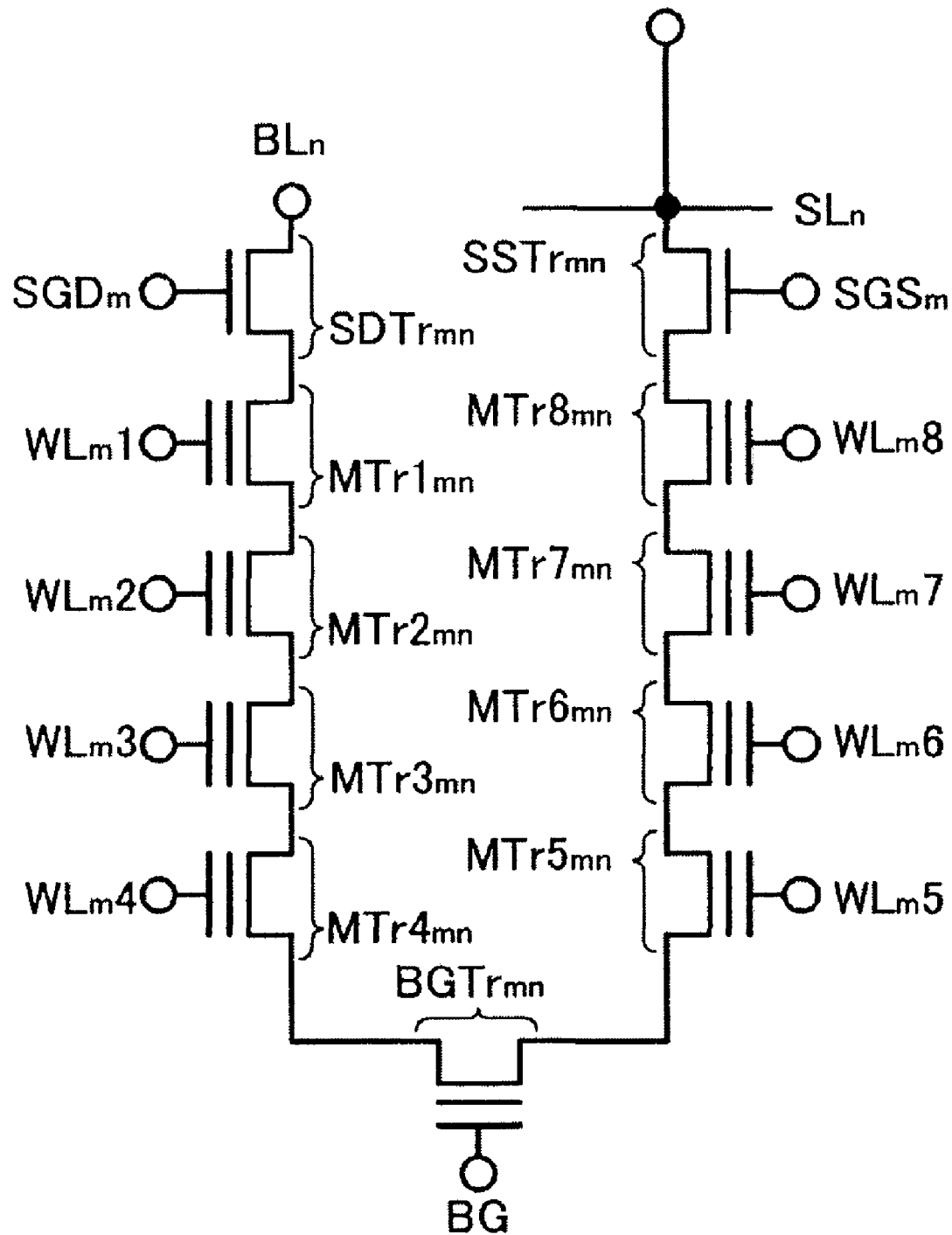
FIG. 16 is a circuit diagram of a memory string in the semiconductor memory device according to the second embodiment of the invention.

FIG. 16 is a circuit view of one memory string MS in this embodiment.

In this embodiment, each of the memory strings MS has eight memory transistors MTr1*mn* to MTr8*mn*, a source-side selection transistor SSTrmn, a drain-side selection transistor SDTrmn, and a back gate transistor BGTrmn. These are connected serially. To the source line SLn, a control circuit, which is not shown, is connected.

Each of the memory transistor MTr1*mn* to MTr8*mn* is composed of the above-described column part CLmn, the ONO layer NL including the charge trap layer EC, and each of the word line WLm1 to WLm8. The part contacting the ONO layer NL in each of the word line WLm1 to WLm8 functions as a control gate electrode of each of the memory transistor MTr1*mn* to MTr8*mn*.

The drain-side selection transistor SDTrmn is composed of the column part CLmn, the gate insulator layer DGI, and the drain-side select-gate line SGDm. The part contacting the gate insulator layer DGI in the drain-side select-gate line SGDm functions as a control gate electrode of the drain-side selection transistor SDTrmn.

The source-side selection transistor SSTrmn is composed of the column part CLmn, the gate insulator layer SGI, and the source-side select-gate line SGSm. The part contacting the gate insulator layer SGI in the source-side select-gate line SGSm functions as a control gate electrode of the source-side selection transistor SSTrmn.

The back gate transistor BGTrmn is composed of the junction part JPmn, the ONO layer NL, and the back gate line BG. The part contacting the ONO layer NL in the back gate line BG functions as a control gate electrode of the back gate transistor BGTrmn.

Figures 17A, 17B:
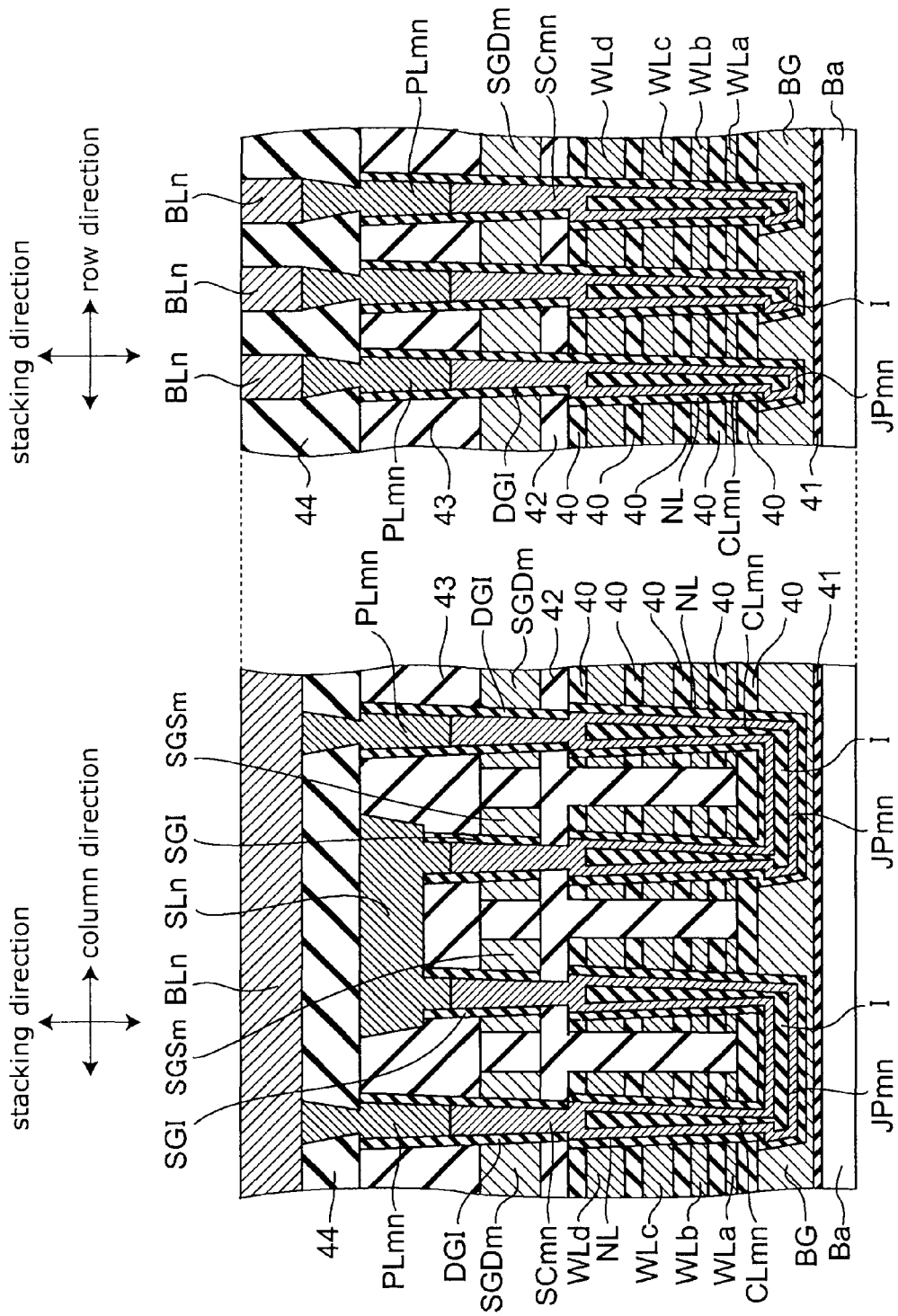
FIGS. 17A and 17B are schematic cross-sectional views illustrating the semiconductor memory device according to the second embodiment of the invention.

Next, with reference to FIG. 17, a specific configuration of the nonvolatile semiconductor memory device according to this embodiment will be described. FIG. 17A shows a section of the column direction in the memory transistor region, and FIG. 17B shows a section of the row direction below the bit line BLn.

The back gate line BG is provided through an insulator film 41 on a semiconductor substrate Ba. The back gate line BG covers the junction part JPmn of the U-shaped semiconductor SCmn through the ONO layer NL.

On the back gate line BG, a plurality of insulator layers 40 made of, for example, silicon oxide and word lines WLa to WLd that are conductive layers made of, for example, amorphous or polycrystalline silicon are alternately stacked. Here, the word line WLa that is the first layer from below corresponds to the word lines WLm4, WLm5 in FIG. 14, and the word line WLa that is the second layer from below corresponds to the word lines WLm3, WLm6 in FIG. 14, and the word line WLa that is the first layer from below corresponds to the word lines WLm2, WLm7 in FIG. 14, and the word line WLa that is the first layer from below corresponds to the word lines WLm1, WLm8 in FIG. 14.

On the stacked body of the insulator layers 40 and the word lines WLa to WLd, the drain-side select-gate line SGDm and the source-side select-gate line SGSm are provided through an insulator layer 42. The drain-side selection transistor is composed by surrounding one upper part of the U-shaped semiconductor SCmn through the gate insulator film DGI by the drain-side select-gate line SGDm. The source-side selection transistor is composed by surrounding the other upper part of the U-shaped semiconductor SCmn through the gate insulator film SGI by the source side select-gate line SGSm.

The upper end of the U-shaped semiconductor SCmn above the drain-side select-gate line SGDm is connected to the bit line BLn through the plug line PLmn. The upper end of the U-shaped semiconductor SCmn above the source-side select-gate line SGSm is connected to the source line SLn. The drain-side select-gate line SGDm, the source-side select-gate line SGSm, the plug line PLmn, and the source line SLn are insulated and separated to one another by an interlayer insulator layer 43. Moreover, the bit line BLn and the source line SLn are insulated and separated by an interlayer insulator layer 44.

The column part CLmn of the U-shaped semiconductor SCmn provided so as to pass through the insulator layers 40 and the word lines WLa to WLd functions as a channel, and each of the word lines WLa to WLd functions as a control gate, and the charge trap layer included in the ONO layer NL functions as a data memory layer for accumulating charge injected from the column part CLmn. That is, in the intersection part of the column part CLmn and each of the word lines WLa to WLd, a memory cell transistor having a structure in which the gate electrode surrounds the channel is formed.

And, also in this embodiment, similar to the above-described first embodiment, by setting the word line to be thinner with the memory cell formed in the column part CLmn having a smaller diameter and by setting the word line to be thicker with the memory cell formed in the column part CLmn having a larger diameter, S factors of the memory cell transistors of the lower side and the upper side can be set to be substantially the same.

Third Embodiment

Figure 18:
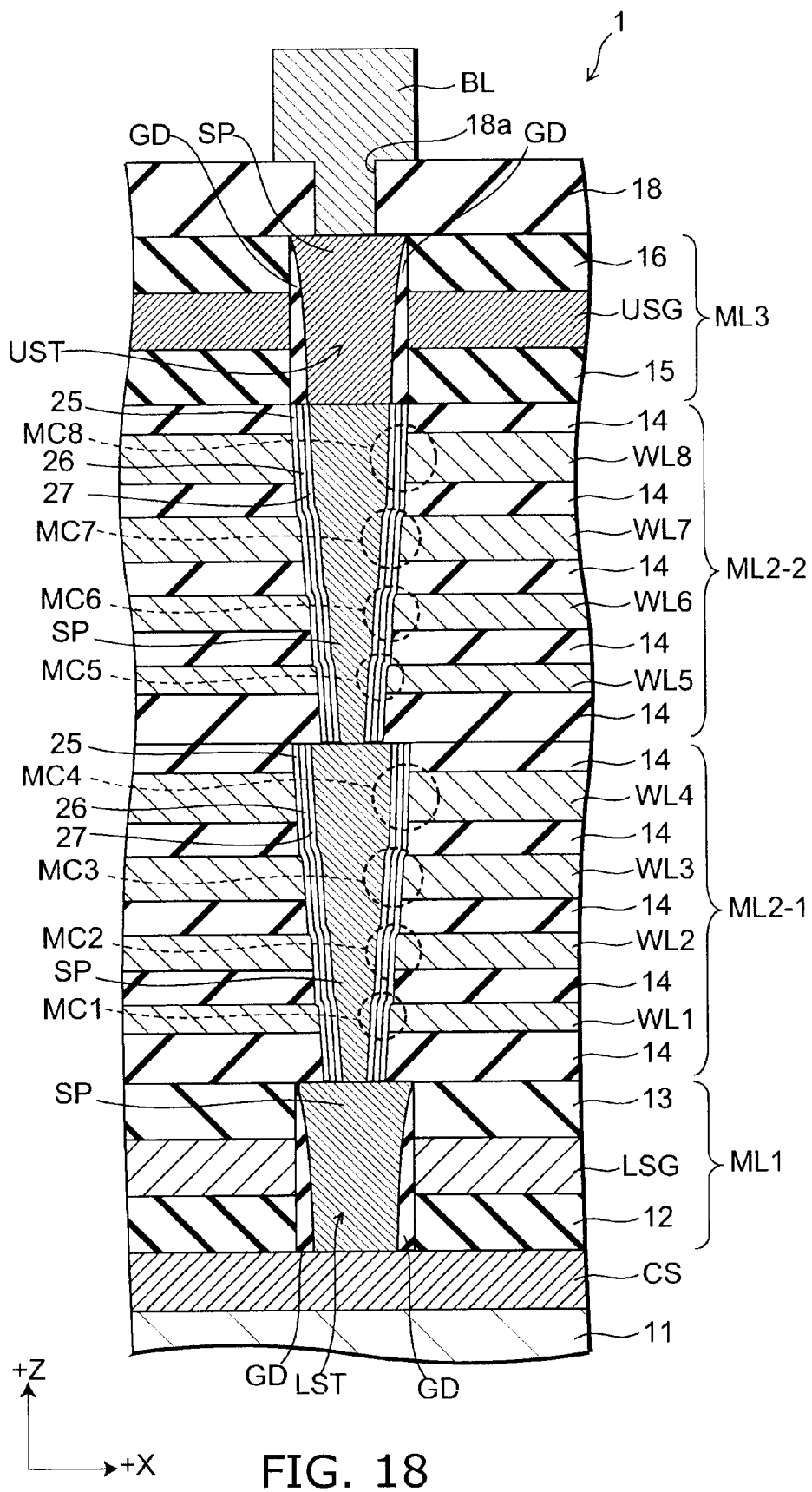
FIG. 18 is a schematic cross-sectional view illustrating a semiconductor memory device according to a third embodiment of the invention.

Next, FIG. 18 is a schematic cross-sectional view of one memory string in an semiconductor memory device according to a third embodiment of the invention. In FIG. 18, with corresponding to the section of FIG. 2 in the above-described first embodiment, occasionally, the same signs are appended to substantially the same component as the first embodiment and the explanation thereof will be omitted.

In this embodiment, by stacking a plurality of memory cell units ML2-1 ML2-2, capacity enlargement of the memory capacity is achieved. Each of the memory cell units ML2-1, ML2-2 corresponds to the stacked body ML2 in FIG. 2.

That is, the memory cell unit ML2-1 has, a stacked body in which a plurality of insulator layers 14 and a plurality of conductive layers WL1 to WL4 are alternately stacked, a silicon pillar SP provided inside a memory hole formed to pass through the stacked body, and a charge trap layer 26 provided between each of the conductive layers WL1 to WL4 and the silicon pillar SP. The silicon pillar SP functions as a channel, and each of the conductive layers WL1 to WL4 functions as a control gate, and the charge trap layer 26 functions as a data memory layer for accumulating charge injected from the silicon pillar SP. That is, in the intersection parts of the silicon pillar SP and the conductive layers WL1 to WL4, the memory cells MC1 to MC4 each having a structure in which the gate electrode surrounds the channel are formed.

Similarly, the memory cell unit ML2-2 has, a stacked body in which a plurality of insulator layers 14 and a plurality of conductive layers WL5 to WL8 are alternately stacked, a silicon pillar SP provided inside a memory hole formed to pass through the stacked body, and a charge trap layer 26 provided between each of the conductive layers WL5 to WL8 and the silicon pillar SP. The silicon pillar SP functions as a channel, and each of the conductive layers WL5 to WL8 functions as a control gate, and the charge trap layer 26 functions as a data memory layer for accumulating charge injected from the silicon pillar SP. That is, in the intersection parts of the silicon pillar SP and the conductive layers WL5 to WL8, the memory cells MC5 to MC8 each having a structure in which the gate electrode surrounds the channel are formed.

The bottom of the silicon pillar SP of the memory cell unit ML2-2 of the upper layer is connected to the upper part of the silicon pillar SP of the memory cell unit ML2-1 of the lower layer, and the silicon pillars SP of the memory cell unit ML2-2 and the memory cell unit ML2-1 are electrically connected. That is, the memory cells MC1 to MC 8 are serially connected, and thereby, one memory string is composed.

And, also in this embodiment, for the memory cell unit ML2-1, by setting the conductive layer to be thinner with the memory cell formed in a part of the silicon pillar SP having a smaller diameter and by setting the conductive layer to be thicker with the memory cell formed in a part of the silicon pillar SP having a larger diameter, S factors of the memory cell transistors of the lower side and the upper side can be set to be substantially the same. Similarly, also for the memory cell unit ML2-2, by setting the conductive layer to be thinner with the memory cell formed in a part of the silicon pillar SP having a smaller diameter and by setting the conductive layer to be thicker with the memory cell formed in a part of the silicon pillar SP having a larger diameter, S factors of the memory cell transistors of the lower side and the upper side can be set to be substantially the same. As a result, variation of S factors among the memory cells MC1 to MC8 can be suppressed.

Moreover, the upper end diameter of the silicon pillar SP in the memory cell unit ML2-1 is larger than the lower end diameter of the silicon pillar SP in the memory cell unit ML2-2. Therefore, if the central lines of the silicon pillar SP of the memory cell unit ML2-2 and the silicon pillar SP of the memory cell unit ML2-1 are slightly displaced, the silicon pillars SP of the memory cell units ML2-1, ML2-1 can be electrically connected.

Next, a method for manufacturing a semiconductor memory device according to the same third embodiment will be described.

Figure 19:
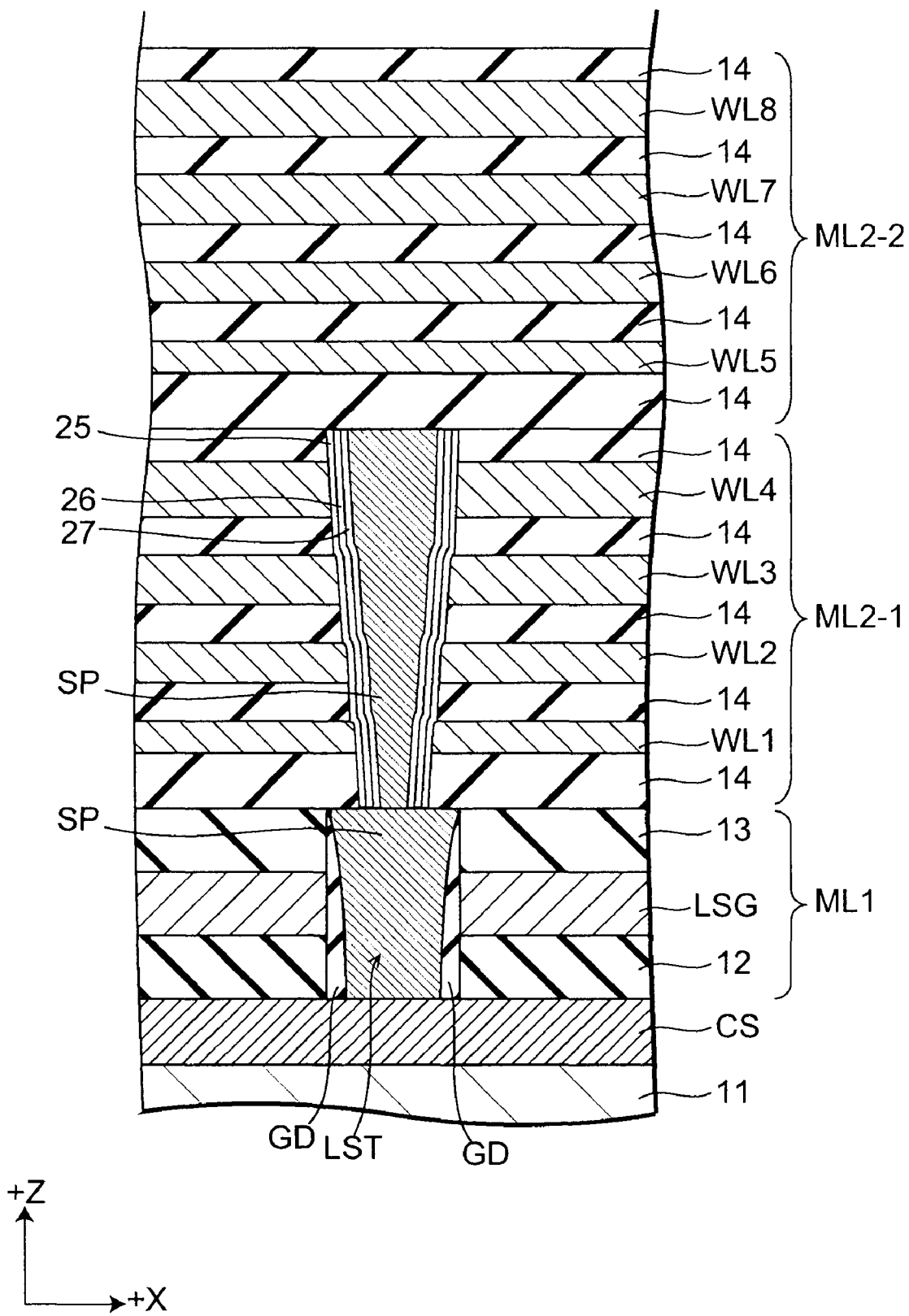
FIG. 19 is a schematic view illustrating a method for manufacturing the semiconductor memory device according to the third embodiment of the invention.

First, after forming the memory cell unit ML2-1 by performing the processes until FIG. 9 in the above-described first embodiment, as shown in FIG. 19, the insulator layers 14 and the conductive layers WL5 to WL8 are alternately stacked on the memory cell unit ML2-1. In this case, the layer thickness is set to be thinner with the conductive layer of the lower layer.

Figure 20:
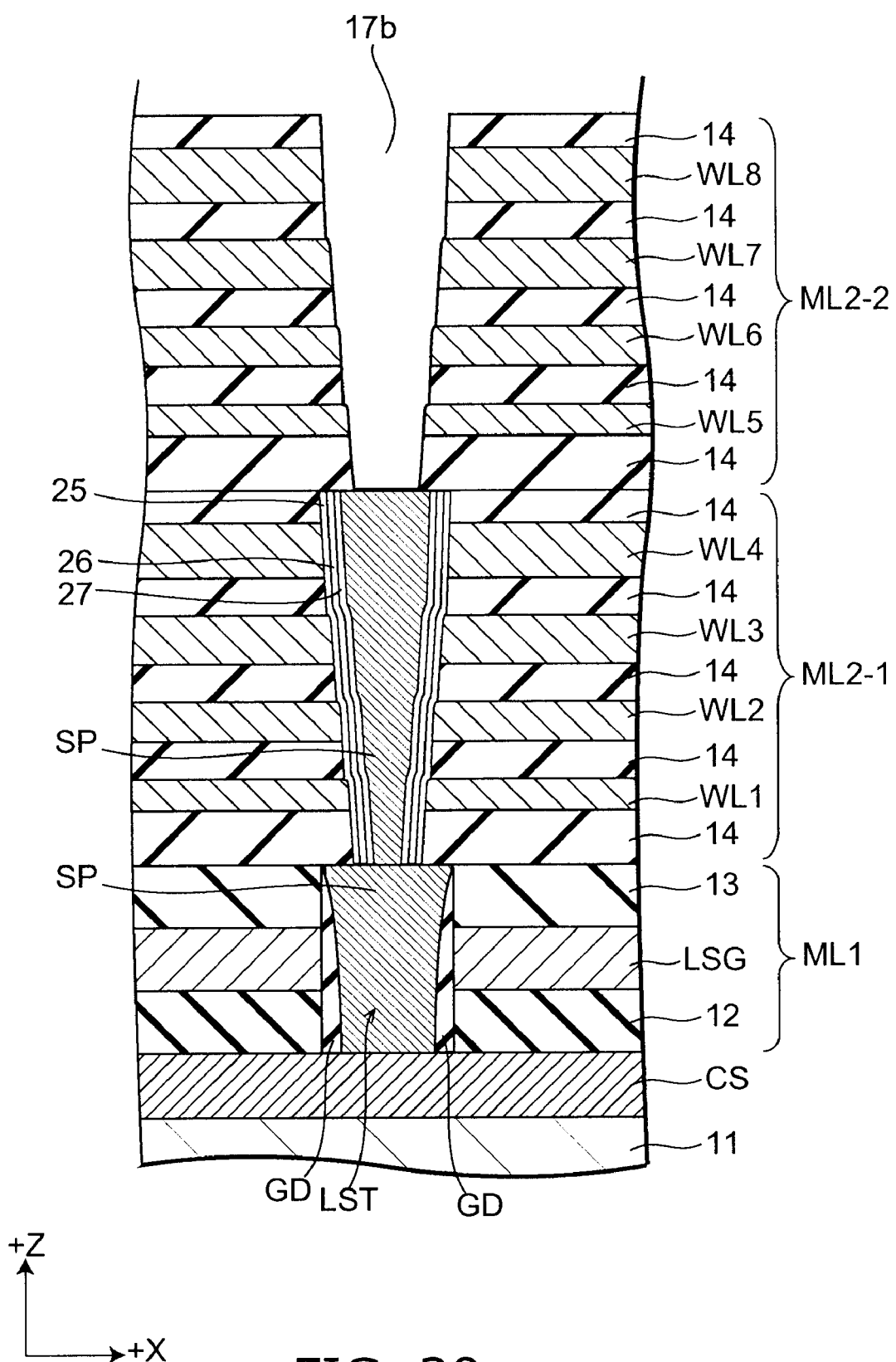
FIG. 20 is a schematic view showing a process following FIG. 19.

Next, as shown in FIG. 20, a hole 17b passing through the insulator layers 14 and the conductive layers WL5 to WL8 is formed above the silicon pillar SP of the memory cell unit ML2-1.

The hole 17b is formed by RIE. In the current process, in particular when the aspect ratio is large, the diameter of the hole 17b does not become constant in the depth direction, but becomes narrower from the upper part of the opening end side to the lower part (the bottom part). More specifically, in the side surface of the hole 17b, slight steps are formed at the boundaries of the respective layers, and the hole 17b becomes narrower in a stepwise manner from the upper part to the lower part. Moreover, the side surface of the hole 17b, namely, the side surface of the insulator layers 14 and the conductive layers WL1 to WL4 exposed to the inside of the hole 17b, is provided with a taper so as to be nearer to the center of the radial direction of the hole 17b in the lower layer side.

Figure 21:
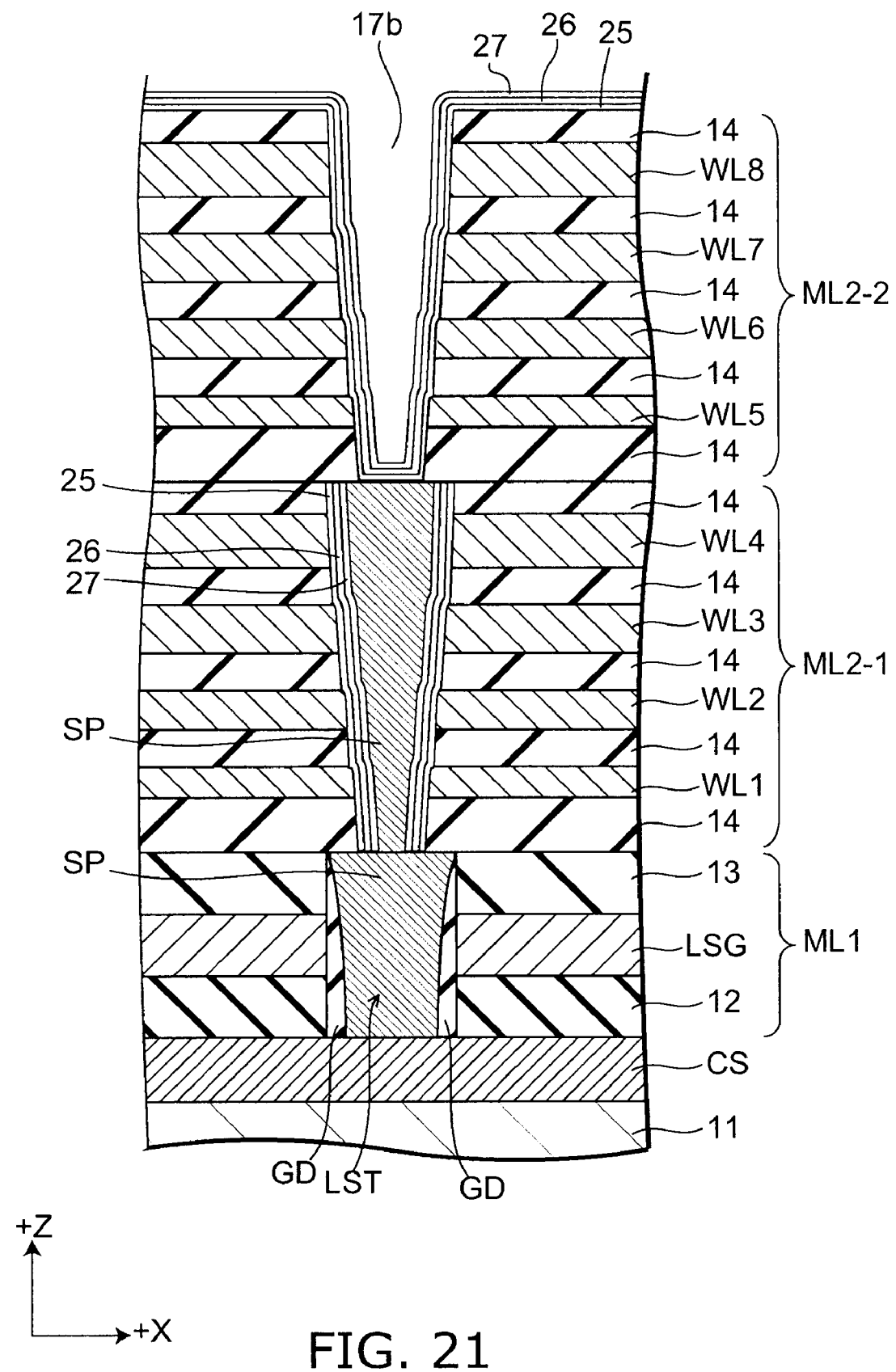
FIG. 21 is a schematic view showing a process following FIG. 20.

After forming the hole 17b, on the side surface of the hole 17b, as shown in FIG. 21, a first insulator film 25, the charge trap layer 26, and a second insulator film 27 are formed in this order.

Figure 22:
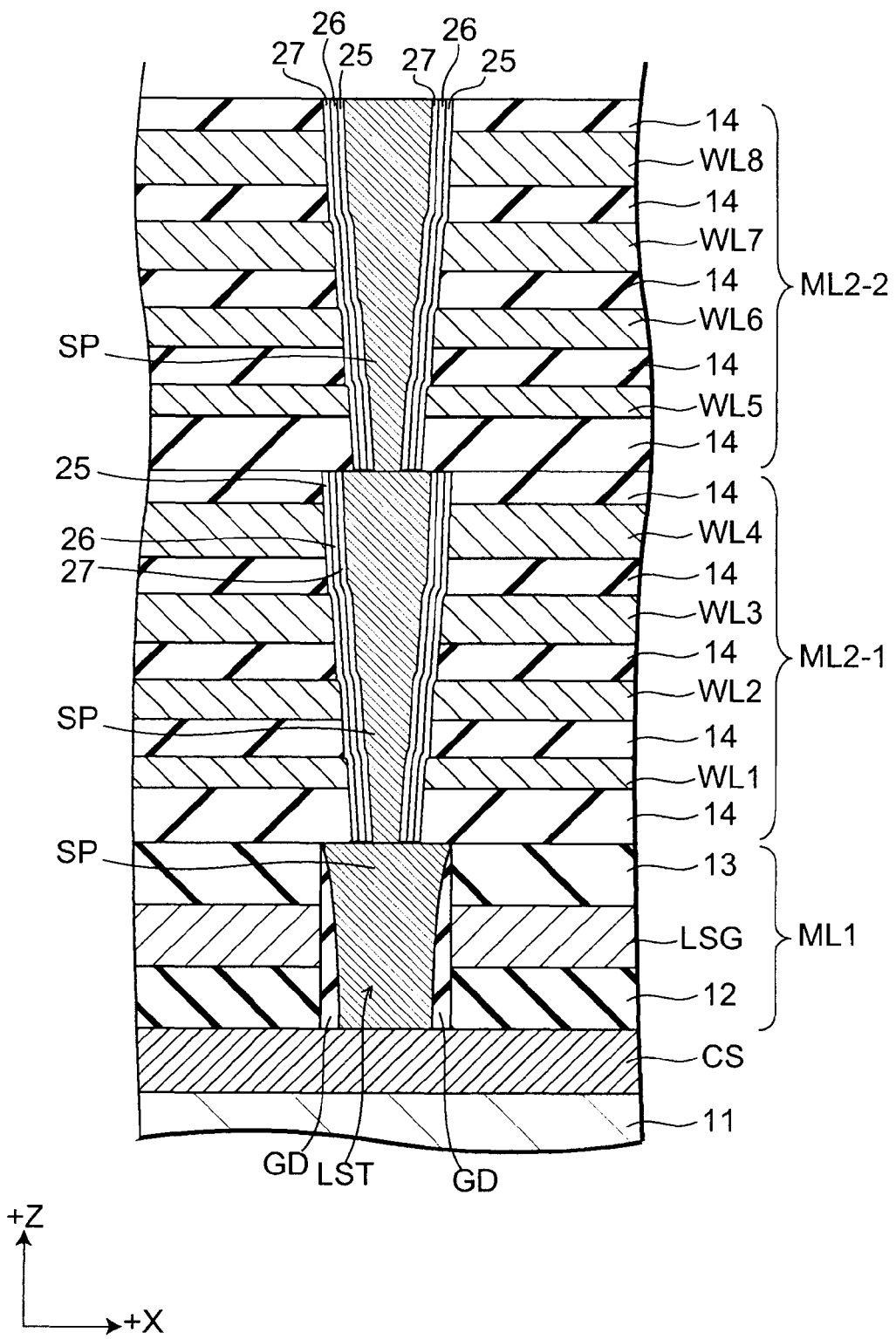
FIG. 22 is a schematic view showing a process following FIG. 21.

Next, after removal of the first insulator film 25 and the charge trap layer 26 and the second insulator film 27 formed on the upper surface of the stacked body and the bottom surface of the hole 17b, as shown in FIG. 22, silicon is buried inside the hole 17b, and thereby, the silicon pillar SP in the memory cell unit ML2-2 is formed. Thereby, in the intersection parts of the silicon pillar SP and the conductive layers WL5 to WL8, memory cells are formed. The silicon pillar SP is formed so as to be narrower in a stepwise manner from above to below in agreement with the shape of the hole 17b.

After then, similar to the first embodiment, formation of the upper selection transistor and so forth is continued. As described above, the embodiments of the invention have been described with reference to the specific examples. However, the invention is not limited thereto, and various modifications based on the technical ideas of the invention are possible.

The silicon pillar may have a rectangular cylindrical shape as well as the circular cylindrical shape. Or, other than that all of the through-holes are buried with the semiconductor layer, the structure in which the semiconductor layer may be formed in a tubular shape only on the part in contact with the first insulator film 27 and an insulator body is buried inside the semiconductor layer is also possible.

The film configuration between the conductive layer (control gate) and the silicon pillar in the memory cell is not limited to the above-described configuration. For example, a bi-layer structure of the charge trap layer (the silicon nitride film) and the gate insulator film (the silicon oxide film) is also possible. Moreover, the memory cell is not limited to the charge trap structure, but a floating electrode structure by using the conductive layer as the charge trap layer may be adopted, and the floating layer may be a Si microcrystal in the insulator film.

The invention claimed is:

1. A semiconductor memory device comprising:
a semiconductor substrate;
a stacked body provided on the semiconductor substrate and having a plurality of insulator layers and a plurality of conductive layers alternately stacked;
a semiconductor layer provided inside a through-hole formed so as to pass through the stacked body and extending in a stacking direction of the plurality of insulator layers and the plurality of conductive layers; and
a charge trap layer provided between each of the conductive layers and the semiconductor layer,
a plurality of memory cells being connected serially in the stacking direction, each of the memory cells including each of the conductive layers, the semiconductor layer and the charge trap layer between each of the conductive layers and the semiconductor layer,
the semiconductor layer in the plurality of memory cells having an upper part and a lower part narrower than the upper part,
a lower layer, in the plurality of conductive layers, facing the lower part of the semiconductor layer being thinner than an upper layer, in the plurality of conductive layers, facing the upper part of the semiconductor layer.

2. The device according to claim 1, wherein the semiconductor layer is narrower in a stepwise manner from the upper part to the lower part.

3. The device according to claim 1, wherein the plurality of conductive layers are thinner in a stepwise manner from the upper layer to the lower layer.

4. The device according to claim 1, wherein a memory cell of the upper layer side and a memory cell of the lower layer side have generally equal switching characteristics.

5. The device according to claim 4, wherein each of the memory cells has a transistor structure in which each of the conductive layers surrounds a surrounding area of the semiconductor layer in a crossover part between the semiconductor layer and the conductive layer.

6. The device according to claim 1, wherein the charge trap layer is an insulator film.

7. The device according to claim 6, wherein the charge trap layer has traps which can store charges.

8. The device according to claim 1, wherein the semiconductor layer is formed in a columnar shape.

9. The device according to claim 1, wherein the semiconductor layer includes silicon.

10. The device according to claim 1, wherein each of the conductive layers is a conductor including doped poly-silicon, silicided-silicon, or metal.

11. A semiconductor memory device comprising:
a semiconductor substrate; and
a plurality of memory cell units stacked on the semiconductor substrate,
the memory cell units including:
a stacked body having a plurality of insulator layers and a plurality of conductive layers alternately stacked;
a semiconductor layer provided inside a through-hole formed to pass through the stacked body and extending in a stacking direction of the insulator layers and the conductive layers; and
a charge trap layer provided between the conductive layer and the semiconductor layer,
a lower part in the semiconductor layer being narrower than an upper part therein in each of the memory cell units, and
at least the lowermost layer in the conductive layers being thinner than the uppermost layer therein in each of the memory cell units.

12. The device according to claim 11, wherein in each of the memory cell units, the semiconductor layer is narrower in a stepwise manner from the upper part to the lower part.

13. The device according to claim 11, wherein in each of the memory cell units, the conductive layers are thinner in a stepwise manner from the uppermost layer to the lowermost layer.

14. The device according to claim 11, wherein a plurality of memory cells including the conductive layer, the semiconductor layer and the charge trap layer between the conductive layer and the semiconductor layer, are connected serially in the stacking direction, and the memory cell of the upper layer side and the memory cell of the lower layer side have generally equal switching characteristics.

15. The device according to claim 14, wherein the memory cell has a transistor structure in which the conductive layer surrounds a surrounding area of the semiconductor layer in a crossover part between the semiconductor layer and the conductive layer.

16. The device according to claim 11, wherein the charge trap layer is an insulator film.

17. The device according to claim 16, wherein the charge trap layer has traps which can store charges.

18. The device according to claim 11, wherein the semiconductor layer is formed in a columnar shape.

19. The device according to claim 11, wherein the semiconductor layer includes silicon.

20. The device according to claim 11, wherein the conductive layer is conductor including doped poly-silicon, silicided-silicon, or metal.

* * * * *